(12) United States Patent
Isobe et al.

(10) Patent No.: US 7,994,878 B2
(45) Date of Patent: Aug. 9, 2011

(54) ACOUSTIC WAVE DEVICE AND HIGH-FREQUENCY FILTER USING THE SAME

(75) Inventors: Atsushi Isobe, Kodaira (JP); Kengo Asai, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 243 days.

(21) Appl. No.: 12/473,755

(22) Filed: May 28, 2009

(65) Prior Publication Data
US 2009/0295508 A1 Dec. 3, 2009

(30) Foreign Application Priority Data

May 30, 2008 (JP) ................................. 2008-142961
Mar. 24, 2009 (JP) ................................. 2009-071611

(51) Int. Cl.
*H03H 9/00* (2006.01)
*H03H 9/15* (2006.01)

(52) U.S. Cl. ........................ 333/195; 333/193; 333/154

(58) Field of Classification Search .................. 333/133, 333/193, 194, 195, 196, 150, 154
See application file for complete search history.

(56) References Cited

U.S. PATENT DOCUMENTS

| | | | | |
|---|---|---|---|---|
| 4,635,009 A | * | 1/1987 | Ebata | ............................. 333/195 |
| 7,453,184 B2 | * | 11/2008 | Kando | ....................... 310/313 R |
| 7,741,931 B2 | * | 6/2010 | Matsuda et al. | ............... 333/133 |
| 2011/0037343 A1 | * | 2/2011 | Isobe et al. | ................. 310/313 A |

FOREIGN PATENT DOCUMENTS

| | | |
|---|---|---|
| JP | 10-084247 A | 3/1998 |
| WO | WO 98/52279 A1 | 11/1998 |
| WO | WO 2005/069485 A1 | 7/2005 |
| WO | WO 2006/114930 A1 | 11/2006 |

OTHER PUBLICATIONS

James J. Campbell et al, "A Method for Estimating Optimal Crystal Cuts and Propagation Directions for Excitation of Piezoelectric Surface Waves", IEEE Transactions on Sonics and Ultrasonics, vol. SU-15, No. 4, pp. 209-217, Oct. 1968.

* cited by examiner

*Primary Examiner* — Dean O Takaoka
(74) *Attorney, Agent, or Firm* — Miles & Stockbridge P.C.

(57) ABSTRACT

Boundary acoustic wave devices are both compact and possess excellent temperature stability. Yet these devices have the drawback that the Q value cannot be raised, and a high cost thin-film technology is required. This invention provides a boundary acoustic wave device possessing excellent Q value along with a low cost. A boundary acoustic wave device including a film whose main ingredient is aluminum at a thickness hm, and a shorting reflector (thickness hr) and a IDT with an electrode finger period of lambda, are patterned onto the surface of a theta YX-LN single crystalline piezoelectric substrate; and a silicon oxide film with a thickness h1 and an aluminum nitride film 6 with a thickness h2 are formed on that comb electrode and reflector, wherein:

$2.5 \leq hr/\lambda \leq 8.5\%$ is obtained.

20 Claims, 32 Drawing Sheets

$h_\Delta / \lambda = 0.02$

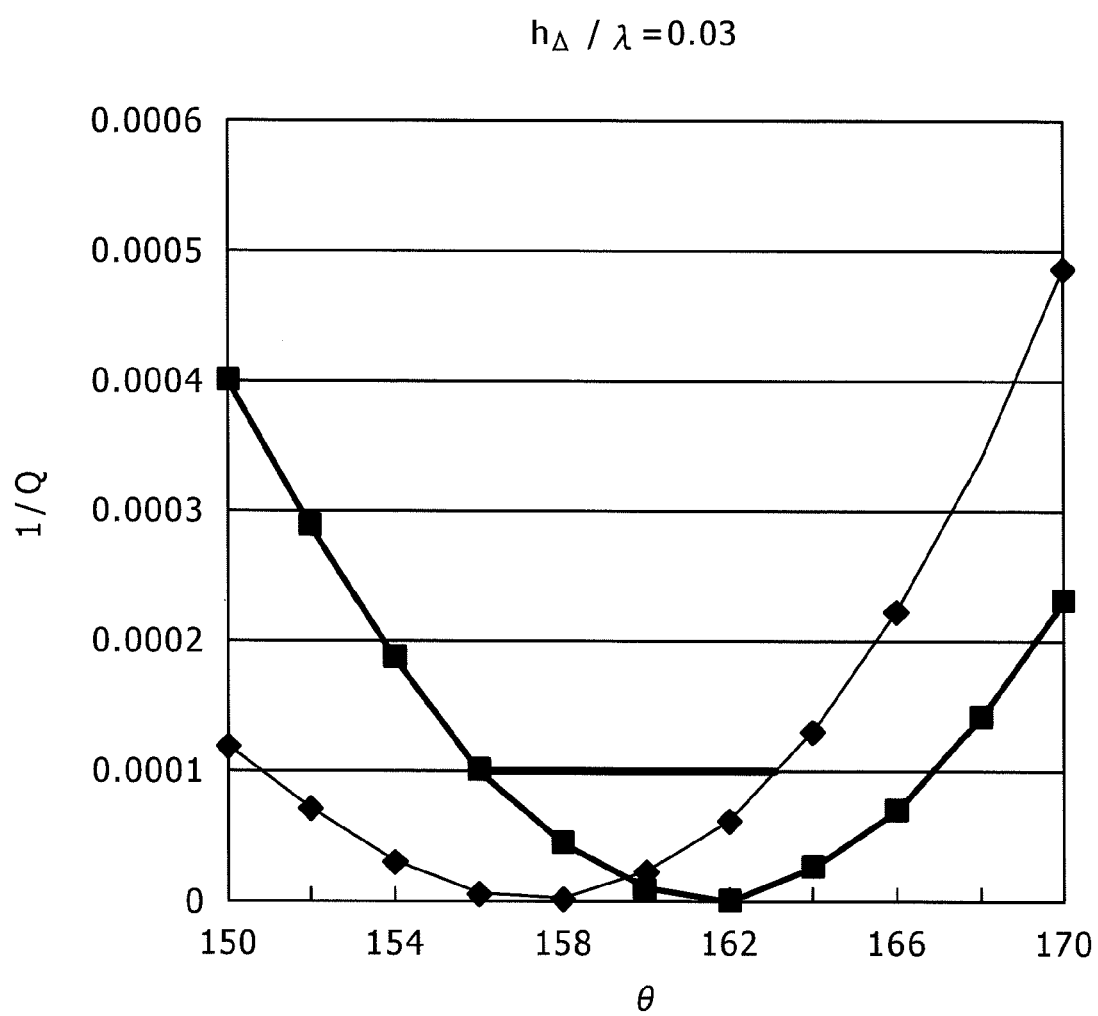

($\delta = 0$, $h_\Delta = h_m$, $h_m/\lambda = 0.03$)

FIG. 9A  $\delta = 0, h_\Delta = 0$

FIG. 9B $\delta = 0.02, h_\triangle = 0$

| $h_1/\lambda$ =(%) | 50 | 55 | 60 | 65 | 70 | 75 | | 50 | 55 | 60 | 65 | 70 | 75 | | 50 | 55 | 60 | 65 | 70 | 75 | | 50 | 55 | 60 | 65 | 70 | 75 |
|---|---|---|---|---|---|---|---|---|---|---|---|---|---|---|---|---|---|---|---|---|---|---|---|---|---|---|---|
| $h_m/\lambda$ =(%) | 2 | 2 | 2 | 2 | 2 | 2 | | 3 | 3 | 3 | 3 | 3 | 3 | | 4 | 4 | 4 | 4 | 4 | 4 | | 6 | 6 | 6 | 6 | 6 | 6 |
| $\theta$ | | | | | | | | | | | | | | | | | | | | | | | | | | | |
| 140 | + | − | − | − | − | − | 140 | + | − | − | − | − | − | 140 | ◁ | − | − | − | − | − | 140 | ◁ | − | − | − | − | − |
| 142 | + | − | − | − | − | − | 142 | + | − | − | − | − | − | 142 | + | − | − | − | − | − | 142 | ◁ | − | − | − | − | − |
| 144 | ▷ | − | − | − | − | − | 144 | + | − | − | − | − | − | 144 | + | − | − | − | − | − | 144 | ◁ | − | − | − | − | − |
| 146 | ▷ | − | − | − | − | − | 146 | ▷ | − | − | − | − | − | 146 | + | − | − | − | − | − | 146 | ◁ | − | − | − | − | − |
| 148 | ▷ | − | − | − | − | − | 148 | ▷ | − | − | − | − | − | 148 | ▷ | − | − | − | − | − | 148 | ◁ | − | − | − | − | − |
| 150 | ▷ | ◁ | + | + | + | − | 150 | ▷ | ◁ | + | + | + | − | 150 | ▷ | ◁ | + | + | + | − | 150 | ◁ | ◁ | + | + | − | − |
| 152 | + | ● | ◁ | + | + | − | 152 | ▷ | ◁ | + | + | + | − | 152 | ▷ | ◁ | + | + | + | − | 152 | + | ◁ | + | + | − | − |
| 154 | + | ▷ | ◁ | + | + | − | 154 | ▷ | ● | ◁ | + | + | − | 154 | ▷ | ◁ | + | + | + | − | 154 | ▷ | ◁ | + | + | − | − |
| 156 | + | ▷ | ◁ | + | + | − | 156 | + | ▷ | ◁ | + | + | − | 156 | ▷ | ● | ◁ | + | + | − | 156 | ▷ | ◁ | + | + | − | − |
| 158 | + | ▷ | ● | + | + | − | 158 | + | ▷ | ◁ | + | + | − | 158 | ▷ | ▷ | ◁ | + | + | − | 158 | ▷ | ◁ | + | + | − | − |
| 160 | + | ▷ | ● | ◁ | + | − | 160 | + | ▷ | ● | + | + | − | 160 | ▷ | ▷ | ◁ | + | + | − | 160 | ▷ | ● | ◁ | + | − | − |
| 162 | + | + | ▷ | ● | * | − | 162 | + | ▷ | ● | * | * | − | 162 | + | ▷ | ● | * | * | − | 162 | ▷ | ▷ | * | * | − | − |
| 164 | + | + | ▷ | * | * | − | 164 | + | + | ▷ | * | * | − | 164 | + | ▷ | ● | * | * | − | 164 | ▷ | ▷ | * | * | − | − |
| 166 | + | + | ▷ | * | * | − | 166 | + | + | * | * | * | − | 166 | + | ▷ | * | * | * | − | 166 | ▷ | * | * | * | − | − |
| 168 | + | + | ▷ | * | * | − | 168 | + | + | * | * | * | − | 168 | + | ▷ | * | * | * | − | 168 | + | * | * | * | − | − |
| 170 | + | + | ▷ | * | * | − | 170 | + | + | * | * | * | − | 170 | + | ▷ | * | * | * | − | 170 | + | * | * | * | − | − |

FIG.9C   $\delta = 0.04, h_\Delta = 0$

| $h_1/\lambda$ (%) | 50 | 55 | 60 | 65 | 70 | 75 | | 50 | 55 | 60 | 65 | 70 | 75 | | 50 | 55 | 60 | 65 | 70 | 75 |
|---|---|---|---|---|---|---|---|---|---|---|---|---|---|---|---|---|---|---|---|---|
| $h_m/\lambda$ (%) | 2 | 2 | 2 | 2 | 2 | 2 | | 3 | 3 | 3 | 3 | 3 | 3 | | 4 | 4 | 4 | 4 | 4 | 4 |
| $\theta$ 150 | ▷ | ◁ | + | + | – | – | 150 | ▷ | ◁ | + | + | – | – | 150 | + | ◁ | + | + | – | – |
| 152 | ▷ | ◁ | + | + | – | – | 152 | ▷ | ◁ | + | + | – | – | 152 | + | ◁ | + | + | – | – |
| 154 | ▷ | ◁ | + | + | – | – | 154 | ▷ | ◁ | + | * | – | – | 154 | ▷ | ◁ | * | * | – | – |
| 156 | ▷ | ◁ | + | * | – | – | 156 | ▷ | ◁ | * | * | – | – | 156 | ▷ | ◁ | * | * | – | – |
| 158 | ▷ | ● | + | * | – | – | 158 | ▷ | ◁ | * | * | – | – | 158 | ▷ | ● | * | * | – | – |
| 160 | + | ▷ | * | * | – | – | 160 | ▷ | ● | * | * | – | – | 160 | ▷ | * | * | * | – | – |
| 162 | + | ▷ | * | * | – | – | 162 | + | * | * | * | – | – | 162 | * | * | * | * | – | – |
| 164 | + | ▷ | * | * | – | – | 164 | ▷ | * | * | * | – | – | 164 | * | * | * | * | – | – |
| 166 | + | * | * | * | – | – | 166 | ▷ | * | * | * | – | – | 166 | * | * | * | * | – | – |
| 168 | + | * | * | * | – | – | 168 | ▷ | * | * | * | – | – | 168 | * | * | * | * | – | – |
| 170 | + | * | * | * | – | – | 170 | * | * | * | * | – | – | 170 | * | * | * | * | – | – |

| | 50 | 55 | 60 | 65 | 70 |
|---|---|---|---|---|---|
| | 6 | 6 | 6 | 6 | 6 |
| 150 | ◁ | + | – | – | – |
| 152 | ◁ | + | – | – | – |
| 154 | ◁ | + | – | – | – |
| 156 | ◁ | + | – | – | – |
| 158 | ▷ | * | – | – | – |
| 160 | ▷ | * | – | – | – |
| 162 | * | * | – | – | – |
| 164 | * | * | – | – | – |
| 166 | * | * | – | – | – |
| 168 | * | * | – | – | – |
| 170 | * | * | – | – | – |

FIG. 9D

FIG. 9E  $\delta = 0.02$, $h_\Delta = h_m$

| h₁/λ=(%) | 50 | 55 | 60 | 65 | 70 | 75 | | 50 | 55 | 60 | 65 | 70 | 75 | | 50 | 55 | 60 | 65 | 70 | 75 | | 50 | 55 | 60 | 65 | 70 |
|---|---|---|---|---|---|---|---|---|---|---|---|---|---|---|---|---|---|---|---|---|---|---|---|---|---|---|
| hₘ/λ=(%) | 2 | 2 | 2 | 2 | 2 | 2 | | 3 | 3 | 3 | 3 | 3 | 3 | | 4 | 4 | 4 | 4 | 4 | 4 | | 6 | 6 | 6 | 6 | 6 |
| θ 150 | − | ◁ | + | + | + | − | 150 | ▷ | ◁ | + | + | − | − | 150 | + | + | + | − | − | − | 150 | ◁ | + | + | − | − |
| 152 | − | ◁ | + | + | + | − | 152 | ▷ | ◁ | + | + | − | − | 152 | ▷ | + | + | − | − | − | 152 | ◁ | + | + | − | − |
| 154 | − | ● | + | ◁ | + | − | 154 | ▷ | ◁ | + | + | − | − | 154 | ▷ | ◁ | + | − | − | − | 154 | ◁ | + | + | − | − |
| 156 | − | ● | ◁ | ◁ | + | − | 156 | ▷ | ◁ | + | + | − | − | 156 | ▷ | ◁ | + | − | − | − | 156 | ◁ | + | + | − | − |
| 158 | − | ▷ | ◁ | ◁ | + | − | 158 | ▷ | ● | + | + | − | − | 158 | ▷ | ◁ | + | − | − | − | 158 | ◁ | ◁ | + | − | − |
| 160 | − | ▷ | ● | + | + | − | 160 | + | ▷ | ◁ | * | − | − | 160 | ▷ | ● | + | * | − | − | 160 | ▷ | ◁ | * | * | − |
| 162 | − | ▷ | ● | + | * | − | 162 | + | ▷ | ◁ | * | − | − | 162 | ▷ | ● | ◁ | * | − | − | 162 | ▷ | ◁ | * | * | − |
| 164 | − | ▷ | ▷ | * | * | − | 164 | + | ▷ | ● | * | − | − | 164 | + | ▷ | * | * | − | − | 164 | ▷ | * | * | * | − |
| 166 | − | + | ▷ | * | * | − | 166 | + | ▷ | ● | * | − | − | 166 | + | ▷ | * | * | − | − | 166 | ▷ | * | * | * | − |
| 168 | − | + | * | * | * | − | 168 | + | ▷ | ▷ | * | − | − | 168 | + | * | * | * | − | − | 168 | ▷ | * | * | * | − |
| 170 | − | + | * | * | * | − | 170 | + | ▷ | ▷ | * | − | − | 170 | + | * | * | * | − | − | 170 | * | * | * | * | − |

FIG. 9F $\delta = 0.04, h_\triangle = h_m$

| $h_1/\lambda = (\%)$ | 50 | 55 | 60 | 65 | 70 | 75 | | 50 | 55 | 60 | 65 | 70 | 75 | | 50 | 55 | 60 | 65 | 70 | 75 | | 50 | 55 | 60 | 65 | 70 |
|---|---|---|---|---|---|---|---|---|---|---|---|---|---|---|---|---|---|---|---|---|---|---|---|---|---|---|
| $h_m/\lambda = (\%)$ | 2 | 2 | 2 | 2 | 2 | 2 | | 3 | 3 | 3 | 3 | 3 | 3 | | 4 | 4 | 4 | 4 | 4 | 4 | | 6 | 6 | 6 | 6 | 6 |
| $\theta$ 150 | ▷ | ◁ | + | – | – | – | 150 | ◁ | + | + | – | – | – | 150 | ◁ | + | + | – | – | – | 150 | + | – | – | – | – |
| 152 | ▷ | ◁ | + | – | – | – | 152 | ◁ | + | + | – | – | – | 152 | ◁ | + | + | – | – | – | 152 | + | – | – | – | – |
| 154 | ▷ | ◁ | + | – | – | – | 154 | ▷ | + | + | – | – | – | 154 | ◁ | + | + | – | – | – | 154 | ◁ | – | – | – | – |
| 156 | ▷ | ◁ | + | – | – | – | 156 | ▷ | ◁ | + | – | – | – | 156 | ◁ | + | ✱ | – | – | – | 156 | ◁ | – | – | – | – |
| 158 | ▷ | ◁ | ✱ | – | – | – | 158 | ▷ | ◁ | ✱ | – | – | – | 158 | ▷ | ◁ | ✱ | – | – | – | 158 | ◁ | – | – | – | – |
| 160 | ▷ | ● | ✱ | – | – | – | 160 | ▷ | ● | ✱ | – | – | – | 160 | ▷ | ✱ | ✱ | – | – | – | 160 | ✱ | – | – | – | – |
| 162 | + | ✱ | ✱ | – | – | – | 162 | ▷ | ✱ | ✱ | – | – | – | 162 | ▷ | ✱ | ✱ | – | – | – | 162 | ✱ | – | – | – | – |
| 164 | + | ✱ | ✱ | – | – | – | 164 | ▷ | ✱ | ✱ | – | – | – | 164 | ✱ | ✱ | ✱ | – | – | – | 164 | ✱ | – | – | – | – |
| 166 | + | ✱ | ✱ | – | – | – | 166 | ▷ | ✱ | ✱ | – | – | – | 166 | ✱ | ✱ | ✱ | – | – | – | 166 | ✱ | – | – | – | – |
| 168 | + | ✱ | ✱ | – | – | – | 168 | ✱ | ✱ | ✱ | – | – | – | 168 | ✱ | ✱ | ✱ | – | – | – | 168 | ✱ | – | – | – | – |
| 170 | + | ✱ | ✱ | – | – | – | 170 | ✱ | ✱ | ✱ | – | – | – | 170 | ✱ | ✱ | ✱ | – | – | – | 170 | ✱ | – | – | – | – |

ACOUSTIC WAVE DEVICE AND HIGH-FREQUENCY FILTER USING THE SAME

CLAIM OF PRIORITY

The present application claims priority from Japanese Patent Applications JP 2008-142961 filed on May 30, 2008 and JP 2009-071611 filed on Mar. 24, 2009, the contents of which are hereby incorporated by reference into this application.

FIELD OF THE INVENTION

This invention relates to an acoustic wave device and a high-frequency filter utilizing that acoustic wave device, and more specifically relates to a piezoelectric boundary acoustic wave device and a high-frequency filter utilizing that piezoelectric boundary acoustic wave device containing an IDT (Inter-Digital Transducer) for boundary acoustic wave devices including piezoelectric material and a comb electrode, and ideal for structures made up of solid-state circuit elements such as a high-frequency resonator and filter.

BACKGROUND OF THE INVENTION

Boundary acoustic wave devices are compact and possess excellent temperature stability because no hollow package is required and because silicon oxide is utilized as a temperature compensating film.

WO98/52279 discloses the relation between the Q value, and theta, and film thickness of polycrystalline silicon film in a boundary acoustic wave resonator for leaky boundary acoustic waves including an IDT, silicon oxide film and a polycrystalline silicon film on a substrate mainly of lithium niobate piezoelectric single crystal cut out in a theta-rotated Y cut, and set with the X axis as the acoustic wave propagation direction (abbreviated hereinafter to theta YX-LN single crystalline piezoelectric substrate). Also disclosed is that an aluminum nitride film can be utilized instead of the polycrystalline silicon film.

Japanese Patent Application Laid-Open Publication No. 10-84247 discloses the relation between propagation loss and theta in a boundary acoustic wave device for leaky boundary acoustic waves, including an IDT, silicon oxide film, and single crystalline silicon on a theta YX-LN single crystalline piezoelectric substrate.

WO2005/069485 and WO2006/114930 disclose acoustic boundary devices that have small boundary acoustic wave propagation loss.

The non-patent document, "A method for estimating optimal crystal cuts and propagation directions for excitation of piezoelectric surface waves" (J. J. Campbell and W. R. Jones, IEEE Trans. Sonics and Ultrason., Vol. SU-15 (1968) pp. 209-217) reports on a method for estimating acoustic boundary wave propagation loss.

SUMMARY OF THE INVENTION

High-frequency (RF) filters must generally be easy to manufacture and possess a high quality factor (device Q value). Using these devices in communication device applications such as cellular telephones in particular requires a Q value of several thousand or higher. The boundary acoustic wave resonators disclosed in the above WO98/52279 and Japanese Patent Laid-Open Publication No. 10-84247 possess the following problems.

Unlike the boundary acoustic waves described in WO2005/069485 and WO2006/114930, the main boundary acoustic waves exciting and resonating in the IDT in WO98/52279 and Japanese Patent Application Laid-Open Publication No. 10-84247 and in this invention are leaky boundary acoustic waves. The leaky boundary acoustic wave resonator generates Stonely wave type boundary acoustic waves, slow shear wave type bulk waves, fast shear wave type bulk waves, and longitudinal wave type bulk waves as spurious acoustic waves. FIG. 23 is a drawing for describing the spurious waves generated via the impedance characteristics of the leaky boundary acoustic wave resonator. The horizontal axis indicates frequency (=acoustic velocity×lambda ($\lambda$)) and the vertical axis indicates the impedance complex components. The "leaky boundary acoustic waves" in the leaky boundary acoustic wave resonator made up of an IDT of low density metal such as in the present invention possess an acoustic velocity that is between the acoustic velocity of slow shear wave type bulk waves and the acoustic velocity of fast shear wave type bulk waves. The "leaky boundary acoustic waves" in other words, possess an acoustic velocity between approximately 4000 and 4800 meters per second. Namely, the slow shear wave type bulk waves are generated relatively close to the low frequency side of the leaky boundary acoustic wave (main signal), and the Stonely wave type boundary acoustic waves at an even lower frequency, and the fast shear wave type bulk waves relatively close to the high frequency side of the leaky boundary acoustic wave, and the longitudinal wave type bulk waves at an even higher frequency. The slow shear wave type bulk waves and the fast shear wave type bulk waves generated near the main signal must therefore be suppressed when fabricating a high-frequency (RF) filter. Moreover, results from investigating the electrical characteristics of leaky boundary acoustic wave resonator in theta YX-LN single crystalline piezoelectric substrates revealed that slow shear wave type bulk waves possess an acoustic velocity near 4000 meters per second. These slow shear wave type bulk waves therefore not only occur directly below the serial resonating frequency of the leaky boundary acoustic waves, but also strongly couple with the IDT so that fabricating a high-frequency (RF) filter for communications devices requires that these slow lateral wave bulk waves be suppressed.

Moreover, unlike the boundary acoustic waves described in WO2005/069485 and WO2006/114930, the main boundary acoustic waves exciting and resonating in the IDT in WO98/52279 and Japanese Patent Application Laid-Open No. 10-84247 and this invention are leaky boundary acoustic waves that also have an acoustic propagation loss. Therefore, in order to obtain a device with a sufficiently high Q value, the device structural factors such as the material, film thickness, and cut angle must be optimal and the propagation loss must be minimized by achieving a maximum acoustic Q value. Additionally a wide-band reflector for trapping a sufficient range of operating frequencies must be placed on both sides of the IDT.

Leaky boundary acoustic waves in this invention are from hereon simply referred to as boundary acoustic waves but needless to say these acoustic waves are different from the boundary acoustic waves of WO2005/069485 and WO2006/114930.

The boundary acoustic wave resonator of WO98/52279 includes an IDT, silicon oxide film and polycrystalline silicon film on the theta YX-LN single crystalline piezoelectric substrate such as shown in FIG. 24. The film thickness value of this polycrystalline silicon film and theta ($\theta$) is an acoustic Q value of one thousand or higher (range where propagation loss is 0.056 dB or lower) is shown in FIG. 25 (equivalent to FIG. 10 of WO98/52279). In other words, an acoustic wave device is disclosed such that $0.585\ \lambda \leq h_1$, moreover $23 \leq \theta \leq 95$ ($113 \leq \theta \leq 185$ according to how theta (or $\theta$) is defined in this invention). However, the Q value of 1000 or higher assumed here as a precondition does not provide sufficient accuracy in high-frequency (RF) filters for example in the 2 GHz class which is typical in recent communications equipment applications.

The polycrystalline silicon film of WO98/52279 includes inductance and a low resistance value. Therefore, even if the theta and film thickness for the polycrystalline silicon film use the same values as in FIG. 25, the acoustic Q value cannot be raised to the level of approximately several thousand to ten thousand required by recent devices.

Page 12 of WO98/52279 discloses use of an aluminum nitride film instead of polycrystalline silicon film. However, this document contains no description that relates the polycrystalline silicon film thickness to boundary acoustic wave resonators using aluminum nitride film where the acoustic Q value is several thousand or higher. The acoustic (or elastic) constant of film whose main constituent is nitride material such as aluminum nitride or silicon nitride is enormously larger than that of polycrystalline silicon film, so comparing this relation by analogy from the description of polycrystalline silicon film in WO98/52279 is impossible.

Forming the surface of the silicon oxide film in the shape shown in FIG. 6 of WO98/52279 is impossible.

The technology of WO98/52279 in other words limits the acoustic insulator film to polycrystalline silicon film, and assumes as preconditions that $h\Delta_1=0$, there are no changes in waveguide layer film quality, and approaches $h\Delta=h_1$, and is moreover selected so that $0.585\lambda \leq h1$, and $113 \leq \theta \leq 185$. The $\theta$ or theta accuracy is therefore inadequate. The Q acquired at this accuracy is about 1000 which in insufficient in terms of acoustic Q values required in modern devices.

The technology of Japanese Patent Application Laid-Open Publication No. 10-84247 utilizes single crystalline silicon in the topmost layer, and this single crystalline silicon has inductance and a small resistance value so that the device Q value cannot be raised. Forming single crystalline silicon in the topmost layer also requires special production equipment so that manufacture is difficult.

In acoustic wave devices using a thin film, the electrical characteristics are dependent on the flatness and the film quality of the thin film being used so the theta ($\theta$) and film thickness must be determined to take these attributes into account. A technique for estimating the boundary acoustic wave propagation loss by adapting the calculation technique described in "J. J. Campbell et al." to boundary acoustic waves has been reported. However in this method, the total weight of the electrode is doubled in order to achieve an IDT that is a nearly uniform metal film resulting in an excessive mass load and other problems such as the fact that reflected/localized boundary acoustic waves at the edges of the electrode finger cannot be taken into account, and that the shape of the boundary contours of the aluminum nitride film and silicon oxide film are not considered, etc.

When producing a boundary acoustic wave device, a piezoelectric substrate is first of all produced at the desired cut angle theta. Next, an electrode film, a silicon oxide film, and a film containing nitrogen material as the main constituent are fabricated at the desired thickness on the produced piezoelectric substrate. However, a high device Q value cannot be obtained unless the desired film quality and flatness is obtained. Various methods were considered in order to obtain a high Q, including: (1) Modify the production equipment and production method to improve the film quality and flatness, (2) Re-produce the device by remanufacturing the piezoelectric substrate with a different cut angle theta+alpha, (3) Produce a device with a corrected film thickness using a already fabricated piezoelectric substrate with cut angle theta, and so on. However the above method (1) is difficult to implement in production; the above method (2) requires time for re-producing the device since fabricating the piezoelectric substrate normally requires a period of one to three months. The above method (3) is therefore considered the optimal method. However when utilizing the above method (3) the problem occurs that any film thickness sometimes does not possess a high device Q value dependent on the cut angle theta.

The main object of this invention is to provide a boundary acoustic wave device and a high-frequency (RF) filter utilizing that boundary acoustic wave device having minimal spurious acoustic waves, a high quality factor (device Q value of several thousand or higher) and that is also easy produce.

A further object of this invention is to provide a boundary acoustic wave device and an high-frequency (RF) filter utilizing that boundary acoustic wave device that is simple to produce and possesses a high quality factor (device Q value) by specifying a cut angle theta ($\theta$) range on the piezoelectric substrate capable of obtaining a high Q value by correcting the film thickness, even in cases where the specified film quality and flatness cannot be obtained in the silicon oxide film and electrode film formed on the piezoelectric substrate.

A yet further object of this invention is to provide a boundary acoustic wave device possessing high-power tolerance and an high-frequency (RF) filter utilizing that boundary acoustic wave device.

A typical aspect illustrating the features of the present invention is related next. Namely, the acoustic wave device of this invention in which an IDT mainly excites boundary acoustic waves, includes: a first medium of lithium niobate single piezoelectric crystal as the main constituent and having a flat surface cut out in a theta ($\theta$) rotated Y cut; and a third medium containing aluminum oxide or nitrogen material as the main constituent; and a second medium containing silicon oxide as the main constituent, and enclosed by the first medium and the third medium; and an IDT formed on the flat surface of the first medium and enclosed between the first medium and the second medium; wherein when the wavelength of the boundary acoustic wave is set as lambda ($\lambda$), the IDT thickness as hm, and the second medium thickness as h1, is set so that the values:

$149° \leq \theta \leq 171°$, and moreover $(hm+h1)/\lambda \leq 77.5\%$ are obtained.

The present invention provides an acoustic wave device having minimal spurious acoustic waves and a high-frequency (RF) filter using that device. The invention also provides an acoustic wave device that is simple to produce and has a high quality factor. Moreover, by utilizing a piezoelectric substrate in a specified cut angle theta ($\theta$) range, and by correcting the film thickness to obtain the device Q value, the present invention provides an acoustic wave device and high-frequency (RF) using that device, that is simple to produce and achieves a high quality factor (device Q value) even in cases where the specified film quality and flatness cannot be obtained in the silicon oxide film and electrode film formed on the piezoelectric substrate.

BRIEF DESCRIPTION OF THE DRAWINGS

FIG. 4B is a graph showing the range found for theta (θ) satisfying the condition 1/Q<0.0001 for both series resonance and parallel resonance, with hΔ/λ=0.03, and utilizing A1N film as the acoustic insulation film;

FIG. 9A is a chart showing propagation characteristics for the boundary acoustic wave when δ=0.00 and hΔ=0;

FIG. 9B is a chart showing propagation characteristics for the boundary acoustic wave when δ=0.02 and hΔ=0;

FIG. 9C is a chart showing propagation characteristics for the boundary acoustic wave when δ=0.04 and hΔ=0;

FIG. 9D is a chart showing propagation characteristics for the boundary acoustic wave when δ=0.00 and hΔ=hm;

FIG. 9E is a chart showing propagation characteristics for the boundary acoustic wave when δ=0.02 and hΔ=hm;

FIG. 9F is a chart showing propagation characteristics for the boundary acoustic wave when δ=0.004 and hΔ=hm;

DETAILED DESCRIPTION OF THE PREFERRED EMBODIMENTS

Several preferred embodiments of the present invention are described in detail next while referring to drawings showing the structure of the boundary acoustic wave device.

First Embodiment

The boundary acoustic wave resonator of a first embodiment of the present invention is described next using FIG. 1 through FIG. 10.

Figure 1:
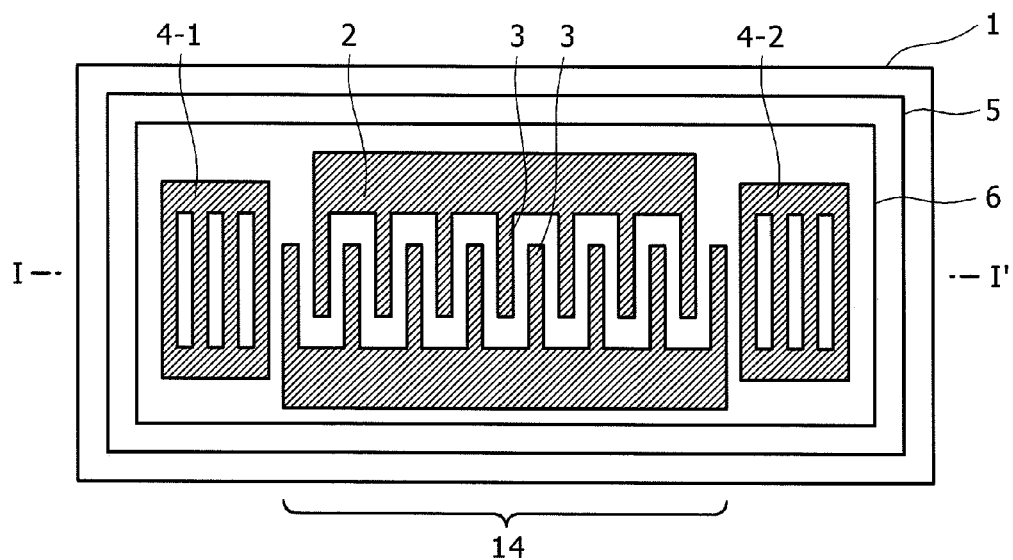
FIG. 1 is a pattern diagram from an upper view, for describing the boundary acoustic wave resonator of a first embodiment of this invention.
Figure 2:
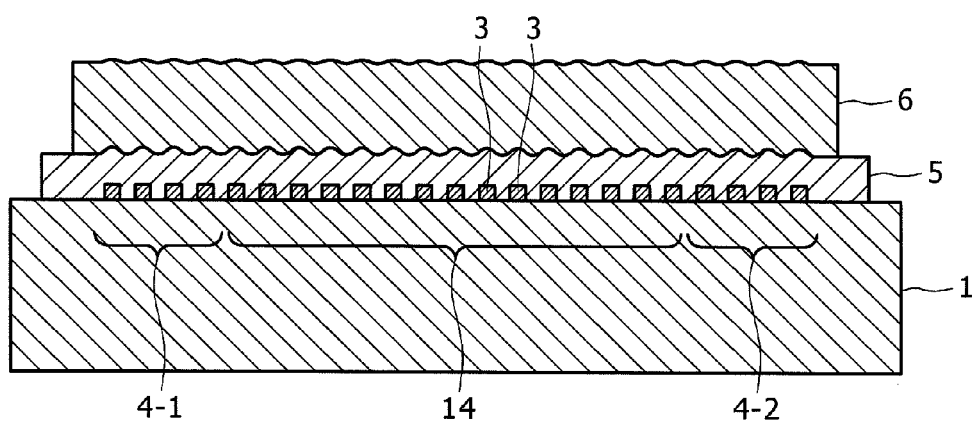
FIG. 2 is a view pattern diagram from a vertical cross sectional view for describing the boundary acoustic wave resonator of the first embodiment of this invention.

FIG. 1 is an upper view pattern diagram for describing the boundary acoustic wave resonator of the first embodiment of this invention. FIG. 2 is a cross sectional view pattern diagram for describing the boundary acoustic wave resonator of the first embodiment and is shown along the cross section I-I' of FIG. 1.

The piezoelectric boundary acoustic wave device of the present embodiment is a one-port resonator, and identical to the structure of the surface acoustic wave resonator of the related art except for the two films formed on the comb electrode. Namely, this boundary acoustic wave device includes a comb type IDT 14 of metal film of aluminum as the main constituent and patterned on the surface of a theta (θ) YX-LN single crystalline piezoelectric substrate 1. The IDT 14 includes bus bars 2 and electrode fingers 3. A high-frequency (RF) signal is applied across the two electrodes where the electrode fingers 3 are inserted at an interval. The reflectors 4 formed from a metallic film with aluminum as the main constituent is mounted on both sides of the IDT 14. All of the electrode fingers 3 are a film thickness hm, a width L, and an electrode finger period of lambda (λ) (matches with the propagation wavelength of the boundary acoustic wave). A gap of a width S is formed between the adjacent electrode fingers. A silicon oxide film 5 with a film thickness of h1 is formed on the reflector 4 and IDT 14. An aluminum nitride film 6 with a film thickness of h2 is formed on the surface of the silicon oxide film 5.

As one example, on the IDT 14 the film thickness hm of the electrode fingers 3 is 70 nm, the electrode finger period lambda (λ) is 2 μm, the width L equals the width S of 0.5 μm, electrode fingers of 100 pairs, and the aperture length is 10λ. The film thickness h1 of the silicon oxide film 5 is 1.4 μm, and the film thickness h2 of the aluminum nitride film 6 is 6 μm.

A feature of the present embodiment is that a three-layer medium structure is formed from a theta (θ) YX-LN single crystalline piezoelectric substrate 1, and a silicon oxide film 5 and an aluminum nitride film 6: separate the medium enclosing the boundary acoustic wave (silicon oxide film 5) and the medium converting the electrical signal and mechanical signal ((θ) YX-LN single crystalline piezoelectric substrate 1); and utilize a non-piezoelectric non-metallic film in the medium enclosing the boundary acoustic wave to set factors such as the film thickness hm of finger electrode 3, the thickness h1 of silicon oxide film 5 and the cut angle theta (θ) to a relation in the range specified below. There are no particular restrictions on the structure and quantity of the comb electrodes.

The present inventions utilized boundary acoustic wave resonator simulation technology to investigate the characteristics of this embodiment in detail.

Figure 3:
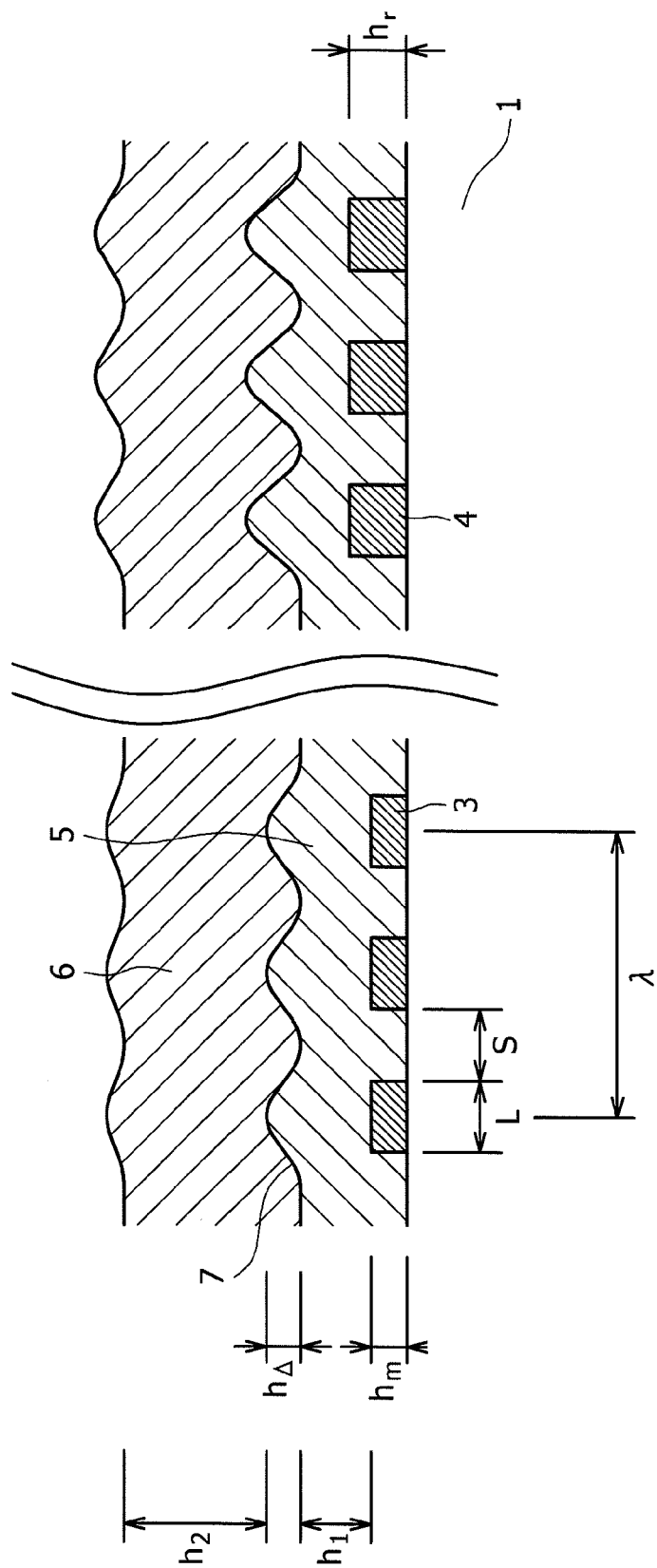
FIG. 3 is a drawing defining the electrode film thickness hm, the silicon oxide film thickness h1, the aluminum nitride film thickness h2, the boundary surface protrusion amount hΔ, the electrode finger line width L, the space S, the wavelength lambda (λ) of the excited boundary acoustic wave, and hr as the reflector thickness.

FIG. 3 is a drawing defining the film thickness hm of the electrode finger 3 on ITD 14, the silicon oxide film 5 thickness h1, the aluminum nitride film 6 thickness h2, the boundary surface 7 protrusion amount hΔ, the electrode finger 3 line width L, the gap S, the wavelength lambda (λ) of the excited boundary acoustic wave (matches the electrode pitch), and hr as the reflector thickness.

The boundary 7 between the silicon oxide film 5 and aluminum nitride film 6 pulsing is dependent on the film thickness of the electrode finger 3. Therefore, h1 is here defined as the distance from the upper surface of electrode finger 3 to the bottommost surface of boundary 7; and h2 is defined as the distance from the uppermost surface of boundary 7 to the bottommost surface of the aluminum nitride film 6.

The resonant frequency of the boundary acoustic wave resonator is determined by the ratio of the boundary acoustic wave propagation velocity to the electrode pitch (λ). The acoustic velocity of the boundary acoustic wave on the θ YX-LN single crystalline piezoelectric substrate 1 is approximately 4300 meters per second, and the lambda (λ) is approximately 2 μm on the 2 GHz band. The L and S at this time can be set comparatively freely however in view of mass production needs the L and S should preferably be set to a large figure. Namely, the minimum processing dimensions are largest when L=S=0.5 μm and best suited for mass production.

Acoustic boundary wave propagation loss is greatly affected by the gap between the electrode fingers. The calculation method described in "J. J Campbell et al" is for an electrode of uniform metallic film and therefore has the problems that: the total weight of the electrode is doubled resulting in an excessive mass load, the reflected/localized boundary acoustic waves at the edges of the electrode finger 3 cannot be taken into account, and that the boundary contour 7 of the aluminum nitride film 6 and silicon oxide film 5 is not considered, etc. The present inventors utilized boundary acoustic wave resonator simulation technology described in WO98/52279 to make a detailed investigation of the acoustic properties of boundary acoustic waves taking all effects into account such as the contour of the comb electrode.

Figure 4A:
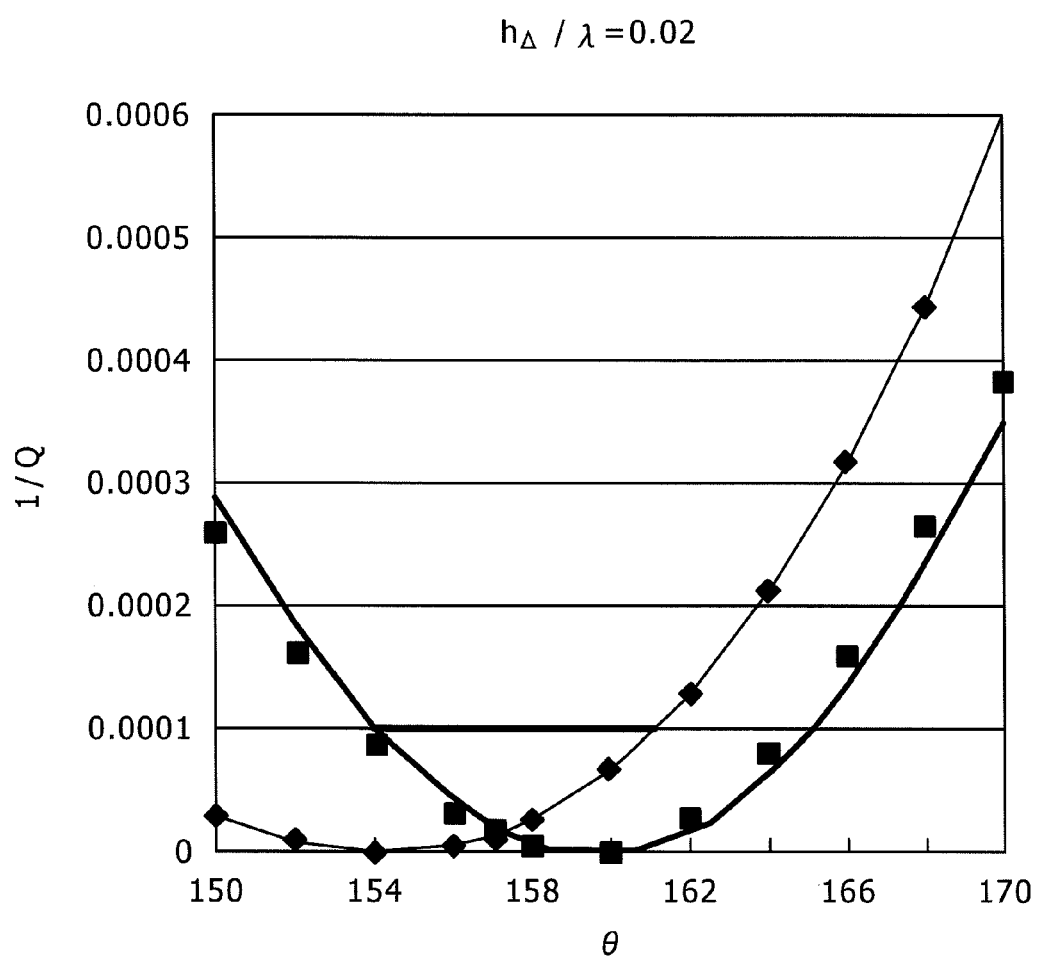
FIG. 4A is a graph showing the range found for theta (θ) satisfying the condition 1/Q<0.0001 for both series resonance and parallel resonance, with hΔ/λ=0.02, and utilizing A1N film as the acoustic insulation film.
Figure 4C:
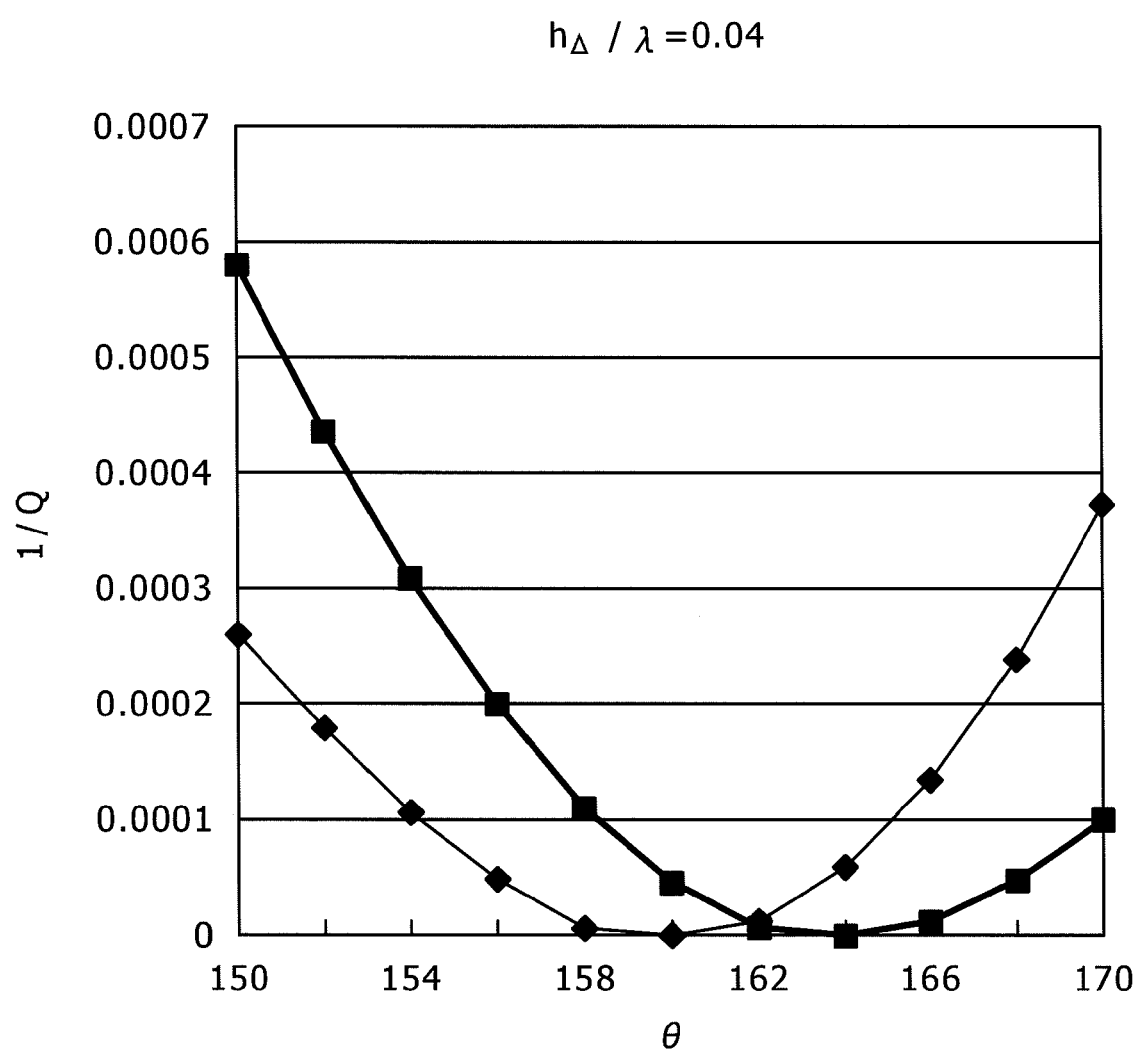
FIG. 4C is a graph showing the range found for theta (θ) satisfying the condition 1/Q<0.0001 for both series resonance and parallel resonance, with hΔ/λ=0.04, and utilizing A1N film as the acoustic insulation film.
Figure 5A:
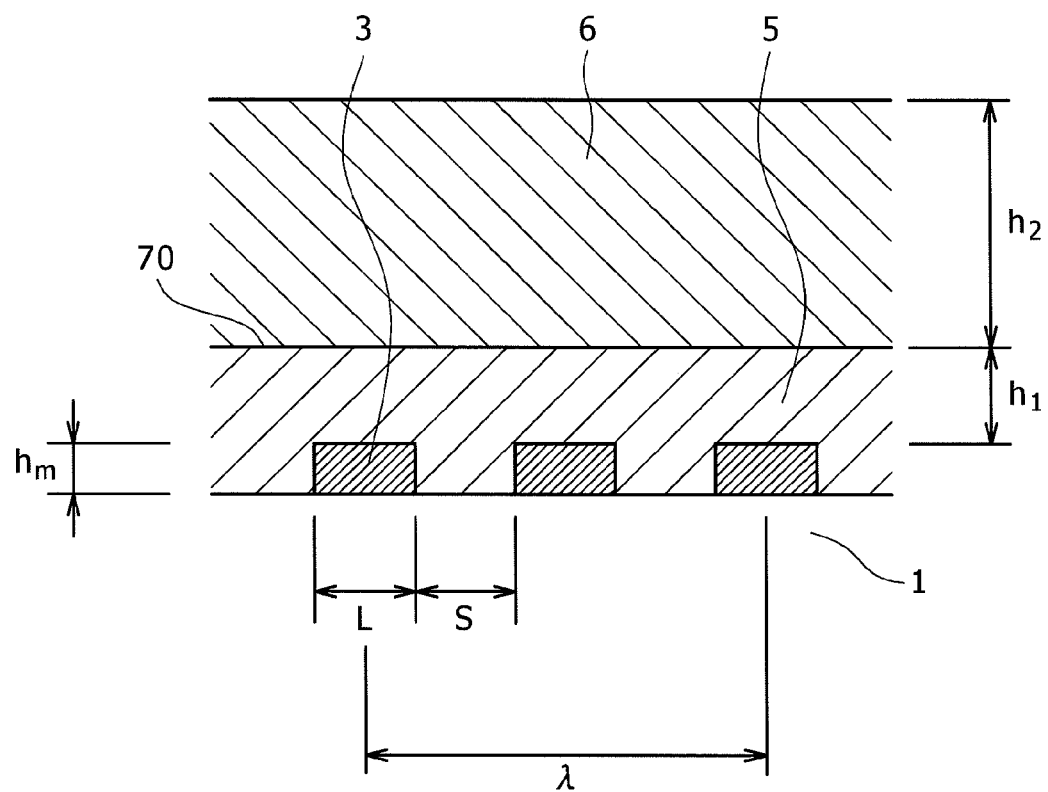
FIG. 5A is a drawing for describing the model utilized in evaluating this invention.
Figure 5B:
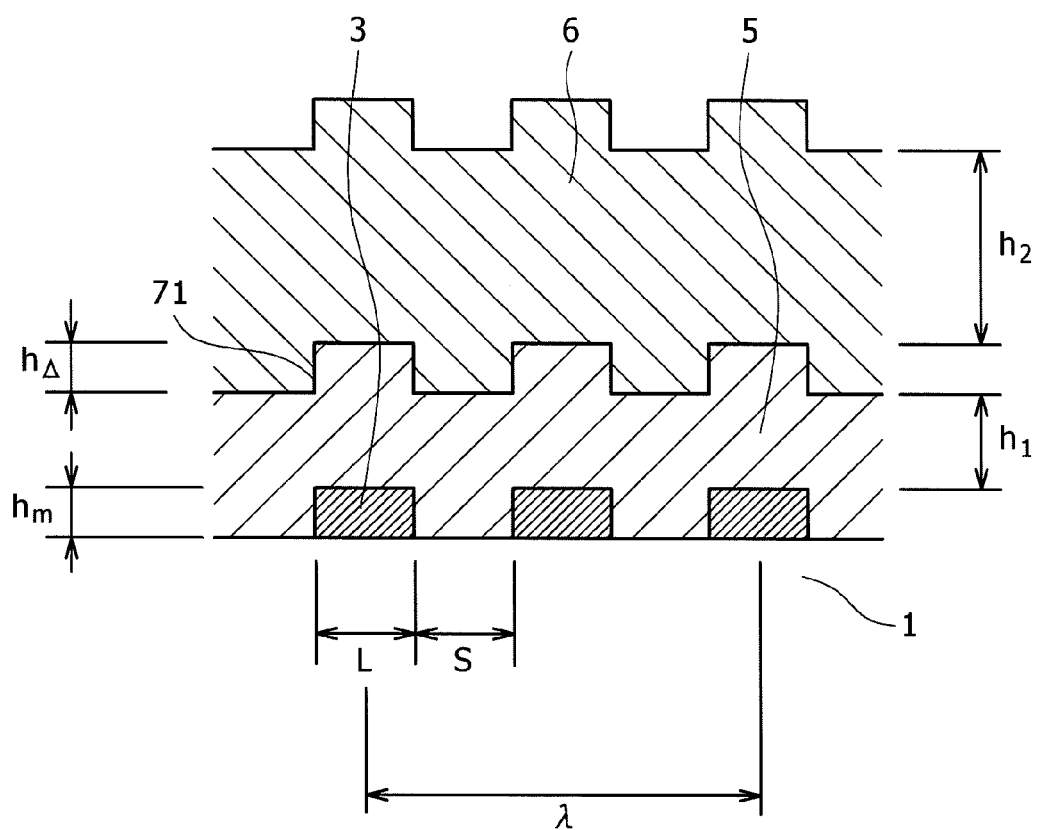
FIG. 5B is a drawing for describing the model utilized in evaluating this invention.

FIG. 4 (FIGS. 4A, 4B, 4C) shows examples of the effect rendered by the undulation quantity hΔ of boundary 7, and using aluminum nitride film as the acoustic insulation film. The theta (θ) range satisfying the condition 1/Q<0.0001 for both series resonance and parallel resonance, is shown (angle range shown by the thick black line in each figure) in FIG. 4A at hΔ/λ=0.02; in FIG. 4B at hΔ/λ=0.03; and in FIG. 4C at hΔ/λ=0.04. Results are given as follows (results below 1 degree are rounded upwards).

$153 \leq \text{theta } (\theta) \leq 161$ in the case where $h\Delta/\lambda=0.02$ $157 \leq \text{theta } (\theta) \leq 161$ in the case where $h\Delta/\lambda=0.03$ $159 \leq \text{theta } (\theta) \leq 165$ in the case where $h\Delta/\lambda=0.04$ As shown here, the undulation quantity on the surface of silicon oxide film 5 generated in the process for forming silicon oxide film 5 using commercial film forming equipment, or in other words the large undulation quantity hΔ of the boundary cannot be ignored when attempting to obtain the acoustically high Q value required in modern devices.

In other cases, deterioration in the film quantity of the waveguide layer must be considered in order to obtain a high Q value. The boundary acoustic wave resonator requires a high Q between the series resonant frequency and the parallel resonant frequency. The present inventors considered these points, and evaluated the Q value at both frequencies, or in other words the acoustic boundary wave for a series resonant Q and a parallel resonant Q.

The hΔ changes in the range, 0<hΔ<hm due to the conditions for forming the silicon oxide film 5. The present inventors utilized two types of models (FIG. 5A and FIG. 5B) after taking note of the fact that the actual element exhibits characteristics for an element with a shape between hΔ=0, and hΔ=hm. The model in FIG. 5A with an undulation quantity hΔ=0 for the boundary 7, and a IDT 14 film thickness hm. In the model in FIG. 5B, hΔ=hm. (The thickness hr of reflector 4 is the same as in FIG. 3.)

The silicon oxide film 5 in the thin film device is a typical porous film. Parameters for rating the film quality of the porous film utilize the density loss rate δ described in WO98/52279. The acoustic constants C11, C44 and density p of the silicon oxide film 5 are expressed as:

$C11 = Co11 \times \exp(-3 \times \delta)$ $C44 = Co44 \times \exp(-3.9 \times \delta)$ $p = po \times (1-\delta)$ Here, the acoustic constant and density of silica glass which is the most dense silicon oxide, were utilized as the Co11, Co44, and po.

The density loss rate δ of silicon oxide film 5 can be suppressed to 0<δ<0.02 in the sputtering method, and 0<δ<0.04 in the CDV method by optimizing the gas ratios and the film forming temperature. In view of this point, the present inventors evaluated those values at both edges, or in other words, the case for the boundary acoustic wave where the density loss rate δ=0, 0.02, and 0.04. The ratio of L and S was also set to 1.

The resonance characteristics of the boundary acoustic wave were investigated in detail by considering the film thickness hm of electrode finger 3, the film thickness h1 of silicon oxide film 5, the cut angle theta (θ), the density loss rate δ of silicon oxide film 5, and the undulation quantity hΔ of boundary 7 as described above.

Figure 6:
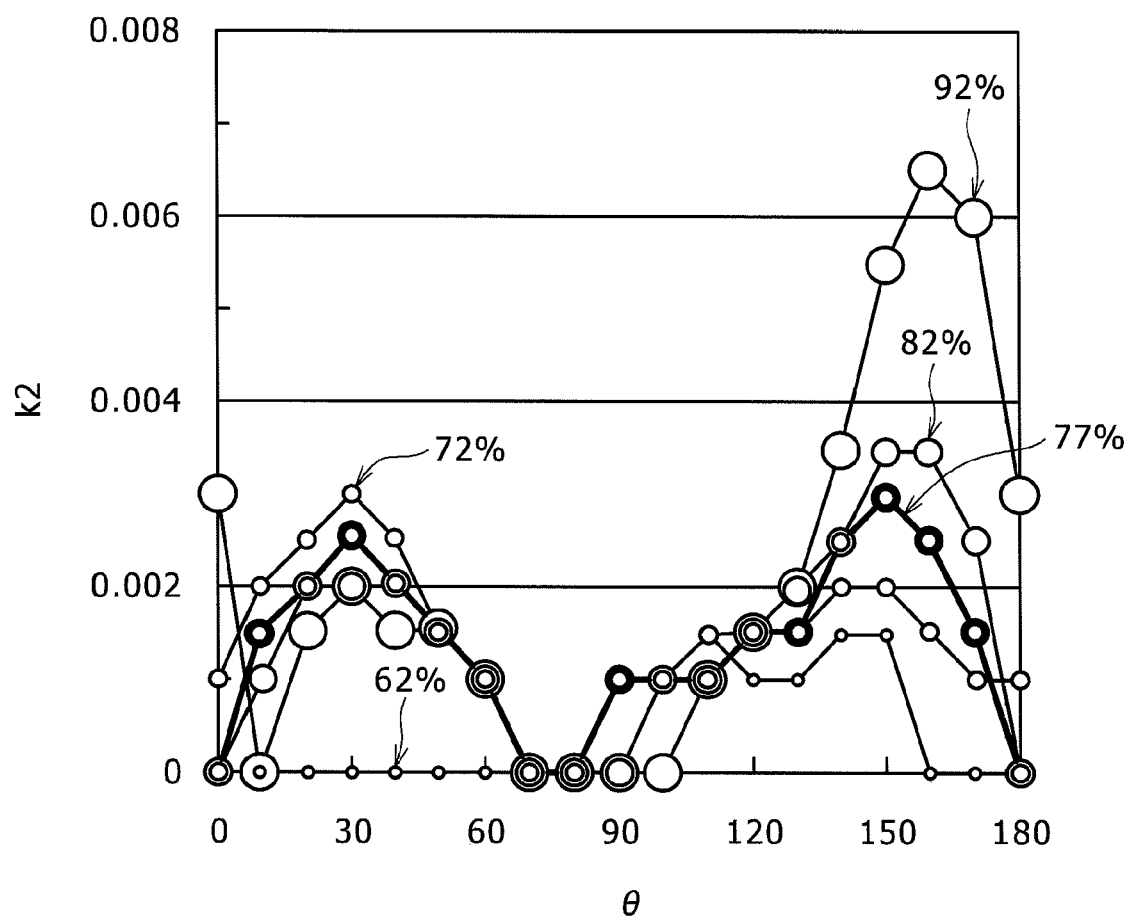
FIG. 6 is a graph showing the relation of the cut angle theta (θ), and ratio of the sum of the IDT film thickness and silicon oxide film thickness calculated by wavelength, and the excitation intensity K2 of the slow shear wave type bulk wave, in the first embodiment of the present invention.

First of all, FIG. 6 is a drawing for describing the excitation intensity of the slow shear wave type bulk waves generated on the low-frequency side of the series resonance frequency. FIG. 6 is in other words, a drawing showing the relation of the excitation intensity K2 of the slow shear wave type bulk wave, with the ratio of the sum (h1+hm) of the IDT14 film thickness and silicon oxide film thickness calculated by wavelength lambda (λ), and the cut angle theta (θ); when the wavelength of the boundary acoustic wave is set as lambda (λ), the thickness of resonator 4 is set as hr, the thickness of the second medium 5 is set as h1, and the thickness of IDT14 is set as hm.

The excitation intensity of the bulk wave is dependent on the configuration of IDT14 so making a quantitative definition has been impossible up to now. However, the present inventors took notice of the fact that bulk wave emissions from conventional leaky type acoustic surface wave resonators, the slow shear wave type bulk waves in leaky boundary acoustic wave resonators are excited within a narrow band; and calculated the binding amount with IDT from the frequency range where complex components of the impedance are positive, assuming that IDT14 is resonating internally the same as the boundary acoustic wave for k2. In these specifications, this value is called the K2 of the slow shear wave type bulk wave. The K2 of the slow shear wave type bulk waves can be lowered by reducing the sum of the IDT14 film thickness and the silicon oxide film 5. So by lowering the sum of the silicon oxide film 5 and the IDT14 film thicknesses (h1+hm) lower than 77% of wavelength for all cut angles θ (0 to 180 degrees), the K2 of the slow shear wave type bulk waves can be lowered to 0.3% or less, or in other words can be set within the tolerance values of filters such as for communication devices. Moreover, by lowering the sum of the silicon oxide film 5 and IDT14 film thicknesses lower than 62% of the wavelength, the K2 of the slow shear wave type bulk waves can be set to 0.15% or lower, or in other words, suppressed to approximately noise level.

Figure 7A:
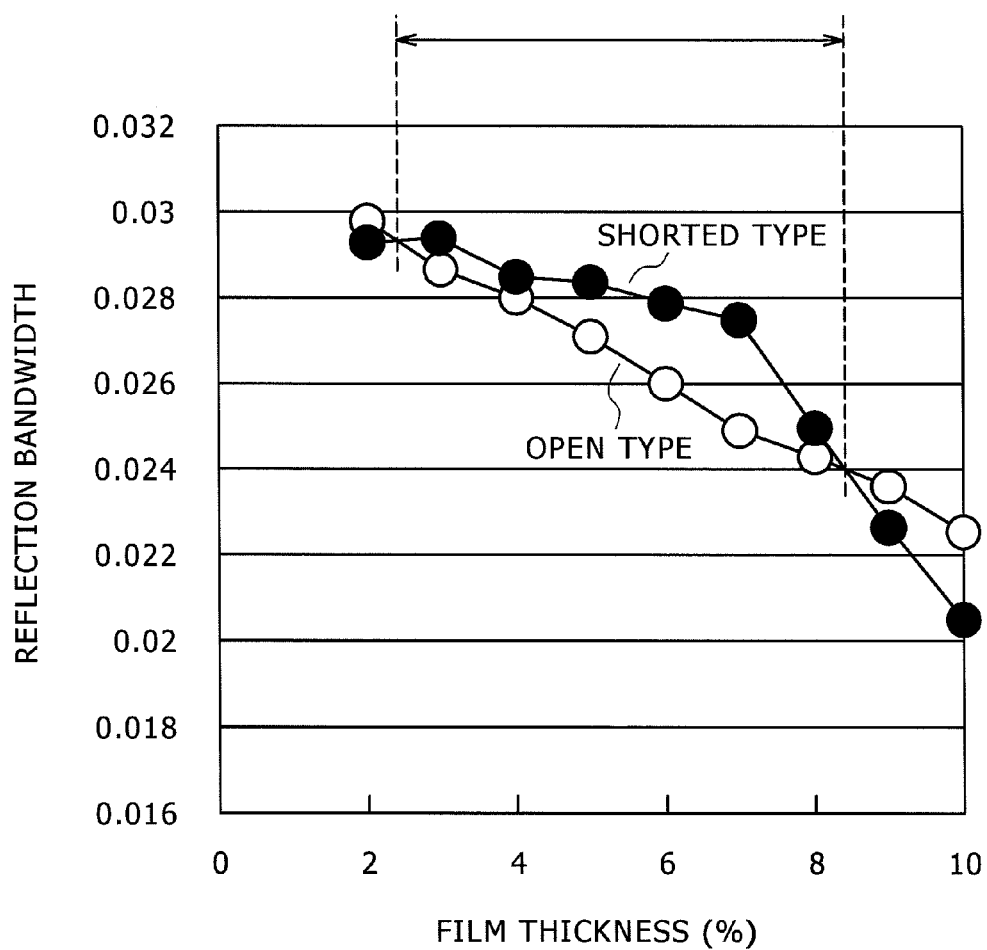
FIG. 7A is a graph comparing the effective reflection bandwidth of the open type reflector, and the shorted type reflector formed from metal film using aluminum as the main constituent in the first embodiment of the present invention.

The reflectivity band width of the reflector versus material dependency in the first embodiment of the present invention is described next. FIG. 7A is a graph comparing the effective reflection bandwidth of the open type reflector described in FIG. 4 of WO98/52279, and the shorted type reflector 4 described in FIG. 1. The material of both reflectors is aluminum. If the film hr in the shorted type reflector is thick, then slow bulk waves of lithium niobate are generated as spurious acoustic waves within the reflection band. The effective reflection bandwidth is therefore set as the one of the wider band of the reflection bands split into two sections by the spurious acoustic waves. At a film thickness hr of 2.5 to 8.5% of the wavelength, the shorted type reflector shows a wider effective reflection bandwidth than the open type reflector.

Figure 7B:
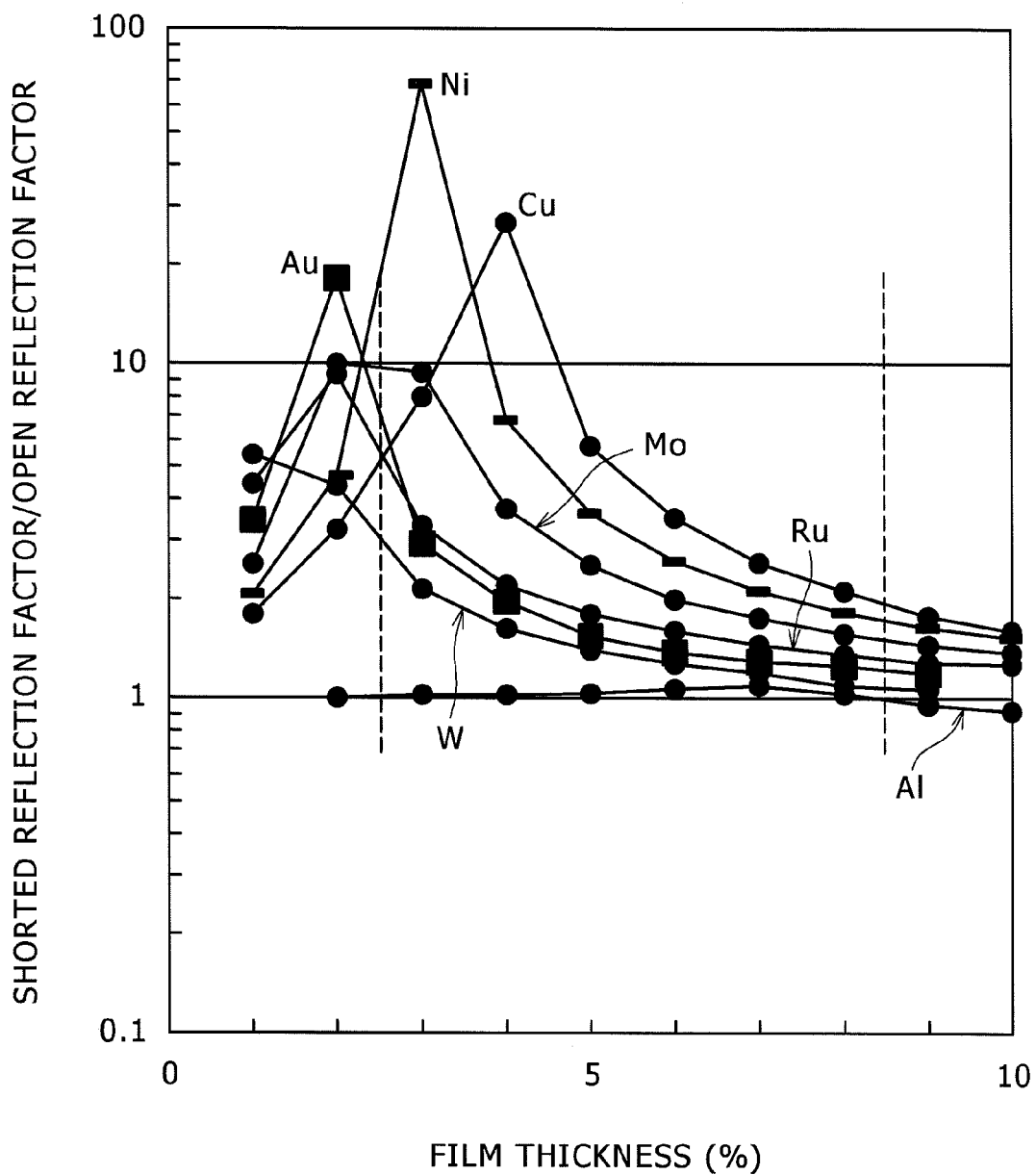
FIG. 7B is a graph for describing the reflectivity of the reflector versus material dependency in the first embodiment.

Moreover, as shown in FIG. 7B, the shorted type reflector will yield higher reflectivity than open type reflectors not only for aluminum but also if large density materials such as gold, nickel, copper, tungsten, molybdenum and ruthenium are used as the reflector material.

Utilizing a shorted type reflector can therefore enlarge the effective reflection bandwidth in leaky boundary acoustic waves. Stated in other words, the shorted type reflector 4 of the first embodiment will have a large reflection factor when $(h1+hm)/\lambda \leq 77.0\%$, and moreover the film thickness hr is in a range between 2.5 to 8.5% of the wavelength. Therefore, an acoustic wave device with even smaller loss can be provided.

The IDT14 in the piezoelectric boundary acoustic wave device of the present embodiment is formed from metal containing aluminum as the main constituent. However what is essential is that the IDT14 mainly functions to excite the leaky boundary acoustic waves formed and therefore the electrode material (in the IDT) need not be limited to aluminum. The same effect can be achieved, by electrode material of alloys made from mixing copper, silicon, and titanium and so on into aluminum, or laminating multiple films made from these alloys. Moreover, utilizing the lower density metals allows minimizing variations in the operating frequencies of the boundary acoustic wave devices that are caused by irregularities or variations in the metal film thickness or patterning the IDT used during production. Further, because it utilizes leaky acoustic boundary waves, and because the metal used as the main constituent in the electrode material is aluminum, the reflection factor of the electrode finger 3 for IDT14 can be minimized, and a large number of electrode finger 3 for IDT14 can be utilized even when operating a double-mode resonator. Consequently, sharp frequency characteristics can be achieved and moreover an acoustic wave device with a small aperture or in other words small electrical loss can be achieved. Besides aluminum, the same effect can be obtained by titanium, or laminated films using these metals as their main constituents.

Figure 8A:
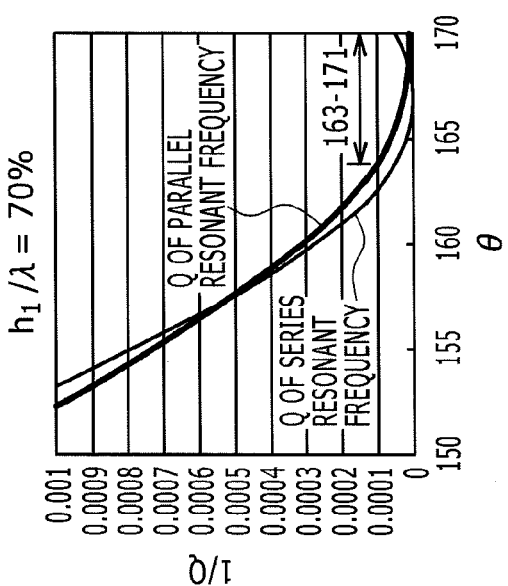
FIG. 8A is graphs showing the range found for theta (θ) satisfying the condition 1/Q<0.0001 for both series resonance and parallel resonance, when h1/λ=60%, δ=0, hΔ=hm, hm/λ=0.03 in the first embodiment.
Figure 8B:
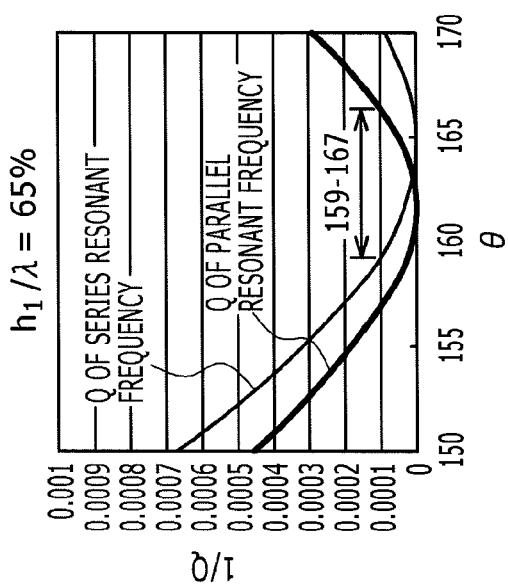
FIG. 8B is graphs showing the range found for theta (θ) satisfying the condition 1/Q<0.0001 for both series resonance and parallel resonance, when h1/λ=65%, δ=0, hΔ=hm, hm/λ=0.03, in the first embodiment.
Figure 8C:
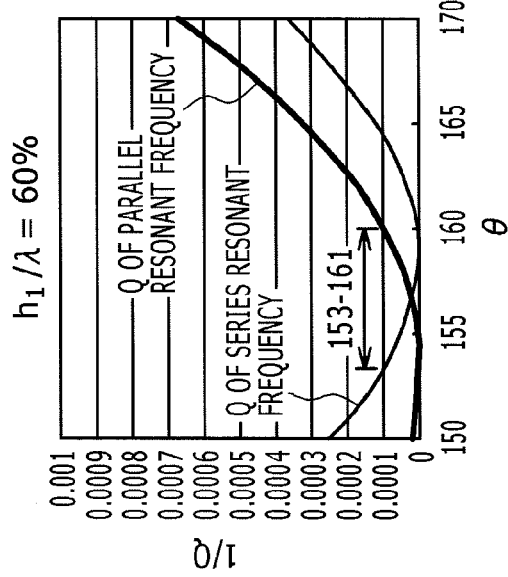
FIG. 8C is graphs showing the range found for theta (θ) satisfying the condition 1/Q<0.0001 for both series resonance and parallel resonance, when h1/λ=70%, δ=0, hΔ=hm, hm/λ=0.03 in the first embodiment.

Next, FIGS. 8A, 8B, and 8C show examples for finding the range of theta (θ) satisfying the condition 1/Q<0.0001 for both series resonance and parallel resonance, while changing h1/λ, when δ=0, hΔ=hm, hm/λ=0.03, and utilizing aluminum nitride as the acoustic insulation film.

As shown in FIGS. 8A, 8B, and 8C, the following was obtained.

At $h1/\lambda=60\%$, $153° \leq \theta \leq 161°$

At $h1/\lambda=65\%$, $159° \leq \theta \leq 167°$

At $h1/\lambda=70\%$, $163° \leq \theta \leq 171°$

The resonance characteristics of the boundary acoustic waves were investigated in detail in the same way. FIG. 9A through FIG. 9F show results from evaluating the boundary-acoustic-wave Q value. In the table, the "Δ" indicates the series resonant Q is lower than 10,000 and the parallel resonant Q is 10,000 or higher; the "●" indicates the series resonant Q and the parallel resonant Q are both 10,000 or higher; the "∇" indicates the series resonant Q is 10,000 or higher and the parallel resonant Q is lower than 10,000; the "+" indicates there is a high Q boundary acoustic wave but the series resonant Q and the parallel resonant Q are both less than 10,000; the "*" indicates the series resonant frequency is lower than the one of the resonant frequency of the slow shear wave type bulk wave, and the "−" indicates the item is not rated.

Figure 9A:
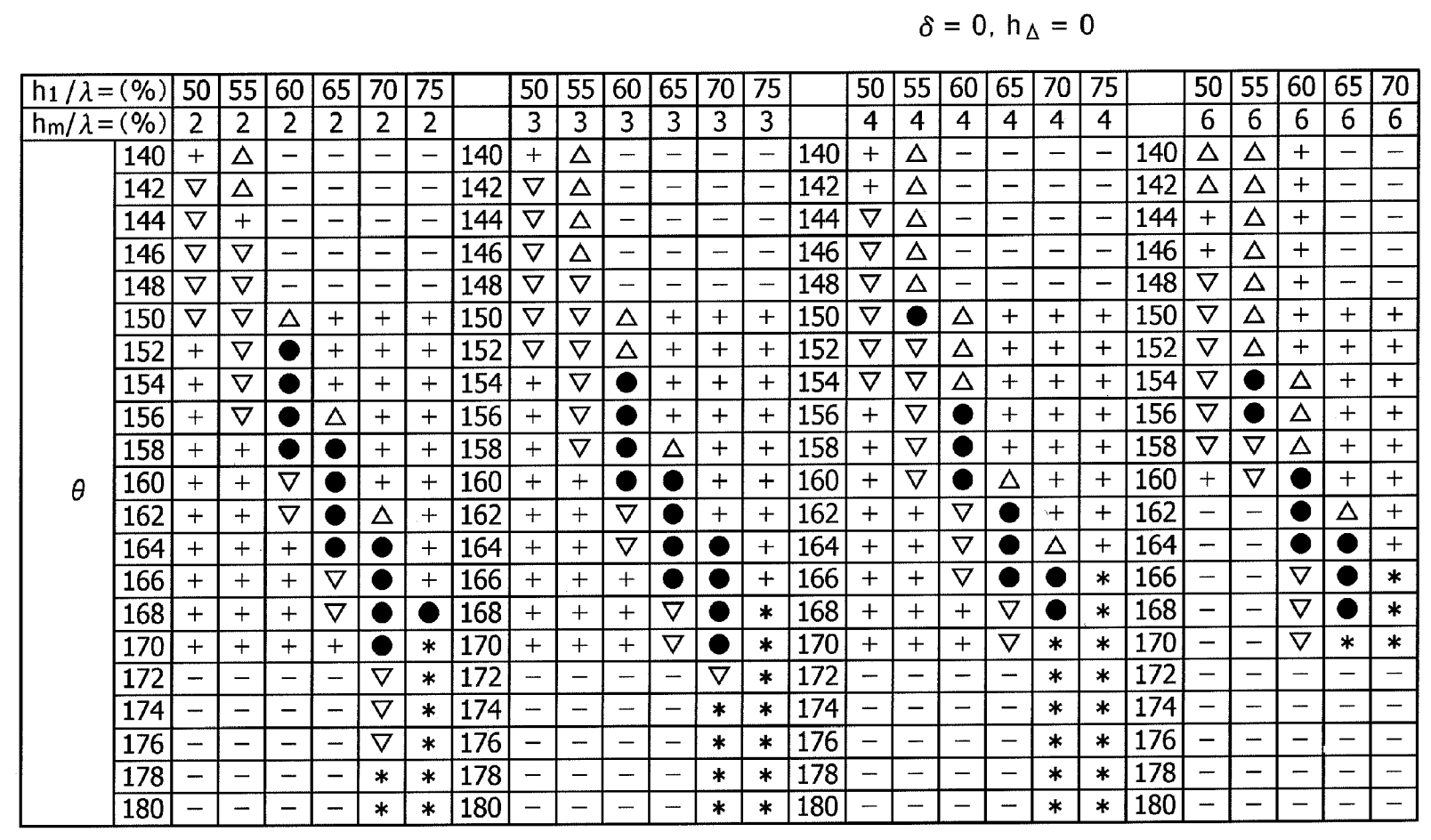

FIG. 9A is a chart showing propagation characteristics for the boundary acoustic wave obtained by simulation, when δ=0.00 and hΔ=0. The range where both the series resonant Q and the parallel resonant Q are 10,000 or higher as indicated by the ● in FIG. 9A is as follows.

When $hm/\lambda=2\%$, and $h1/\lambda=60\%$, $151°\leq\theta\leq159°$

When $hm/\lambda=2\%$, and $h1/\lambda=65\%$, $157°\leq\theta\leq165°$

When $hm/\lambda=2\%$, and $h1/\lambda=70\%$, $163°\leq\theta\leq171°$

When $hm/\lambda=2\%$, and $h1/\lambda=75\%$, $167°\leq\theta\leq169°$

When $hm/\lambda=3\%$, and $h1/\lambda=60\%$, $153°\leq\theta\leq161°$

When $hm/\lambda=3\%$, and $h1/\lambda=65\%$, $159°\leq\theta\leq167°$

When $hm/\lambda=3\%$, and $h1/\lambda=70\%$, $163°\leq\theta\leq171°$

When $hm/\lambda=4\%$, and $h1/\lambda=55\%$, $149°\leq\theta\leq151°$

When $hm/\lambda=4\%$, and $h1/\lambda=60\%$, $155°\leq\theta\leq161°$

When $hm/\lambda=4\%$, and $h1/\lambda=65\%$, $161°\leq\theta\leq167°$

When $hm/\lambda=4\%$, and $h1/\lambda=70\%$, $165°\leq\theta\leq169°$

When $hm/\lambda=6\%$, and $h1/\lambda=55\%$, $153°\leq\theta\leq159°$

When $hm/\lambda=6\%$, and $h1/\lambda=60\%$, $159°\leq\theta\leq165°$

When $hm/\lambda=6\%$, and $h1/\lambda=65\%$, $163°\leq\theta\leq169°$

FIG. 9B is a chart showing propagation characteristics for the boundary acoustic wave obtained by simulation, when $\delta=0.02$ and $h\Delta=0$. The range where both the series resonant Q and the parallel resonant Q are 10,000 or higher as indicated by the ● in FIG. 9B is as follows.

When $hm/\lambda=2\%$, and $h1/\lambda=55\%$, $151°\leq\theta\leq153°$

When $hm/\lambda=2\%$, and $h1/\lambda=60\%$, $159°\leq\theta\leq163°$

When $hm/\lambda=2\%$, and $h1/\lambda=65\%$, $163°\leq\theta\leq165°$

When $hm/\lambda=3\%$, and $h1/\lambda=55\%$, $153°\leq\theta\leq155°$

When $hm/\lambda=3\%$, and $h1/\lambda=60\%$, $161°\leq\theta\leq165°$

When $hm/\lambda=4\%$, and $h1/\lambda=55\%$, $155°\leq\theta\leq157°$

When $hm/\lambda=4\%$, and $h1/\lambda=60\%$, $161°\leq\theta\leq165°$

When $hm/\lambda=6\%$, and $h1/\lambda=55\%$, $159°\leq\theta\leq161°$

FIG. 9C is a chart showing propagation characteristics for the boundary acoustic wave obtained by simulation, when $\delta=0.04$ and $h\Delta=0$. The range where both the series resonant Q and the parallel resonant Q are 10,000 or higher as indicated by the ● in FIG. 9C is as follows.

When $hm/\lambda=2\%$, and $h1/\lambda=55\%$, $157°\leq\theta\leq159°$

When $hm/\lambda=3\%$, and $h1/\lambda=55\%$, $159°\leq\theta\leq161°$

When $hm/\lambda=4\%$, and $h1/\lambda=55\%$, $159°\leq\theta\leq161°$

Figure 9D:
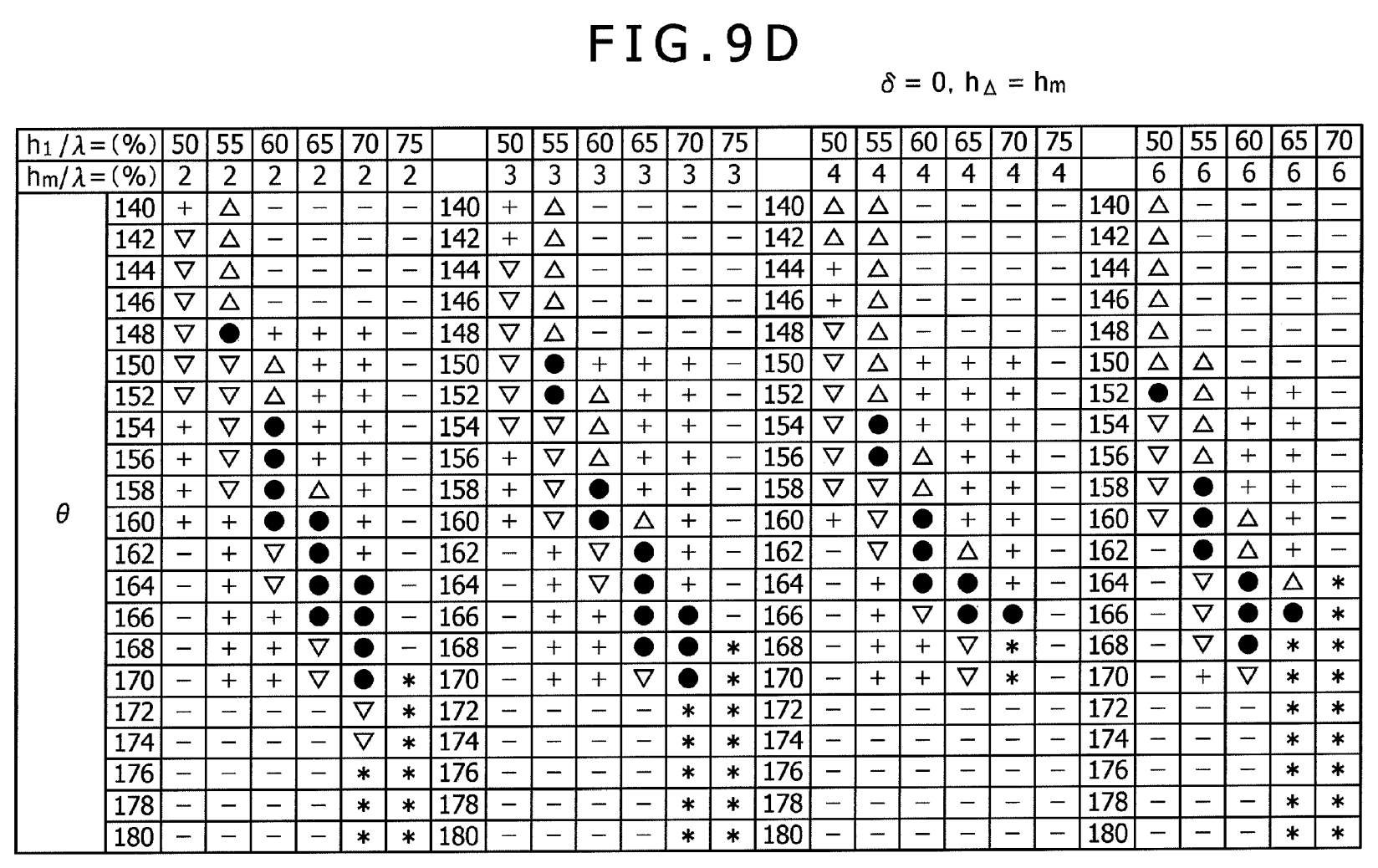

FIG. 9D is a chart showing propagation characteristics for the boundary acoustic wave obtained by simulation, when $\delta=0$ and $h\Delta=hm$. The range where both the series resonant Q and the parallel resonant Q are 10,000 or higher as indicated by the ● in FIG. 9D is as follows.

When $hm/\lambda=2\%$, and $h1/\lambda=55\%$, $147°\leq\theta\leq149°$

When $hm/\lambda=2\%$, and $h1/\lambda=60\%$, $153°\leq\theta\leq161°$

When $hm/\lambda=2\%$, and $h1/\lambda=65\%$, $159°\leq\theta\leq167°$

When $hm/\lambda=2\%$, and $h1/\lambda=70\%$, $163°\leq\theta\leq171°$

When $hm/\lambda=3\%$, and $h1/\lambda=55\%$, $149°\leq\theta\leq153°$

When $hm/\lambda=3\%$, and $h1/\lambda=60\%$, $157°\leq\theta\leq161°$

When $hm/\lambda=3\%$, and $h1/\lambda=65\%$, $161°\leq\theta\leq169°$

When $hm/\lambda=3\%$, and $h1/\lambda=70\%$, $165°\leq\theta\leq171°$

When $hm/\lambda=4\%$, and $h1/\lambda=55\%$, $153°\leq\theta\leq157°$

When $hm/\lambda=4\%$, and $h1/\lambda=60\%$, $159°\leq\theta\leq165°$

When $hm/\lambda=4\%$, and $h1/\lambda=65\%$, $163°\leq\theta\leq167°$

When $hm/\lambda=4\%$, and $h1/\lambda=70\%$, $165°\leq\theta\leq167°$

When $hm/\lambda=6\%$, and $h1/\lambda=50\%$, $151°\leq\theta\leq153°$

When $hm/\lambda=6\%$, and $h1/\lambda=55\%$, $157°\leq\theta\leq163°$

When $hm/\lambda=6\%$, and $h1/\lambda=60\%$, $163°\leq\theta\leq169°$

When $hm/\lambda=6\%$, and $h1/\lambda=65\%$, $165°\leq\theta\leq167°$

FIG. 9E is a chart showing propagation characteristics for the boundary acoustic wave obtained by simulation, when $\delta=0.02$ and $h\Delta=hm$. The range where both the series resonant Q and the parallel resonant Q are 10,000 or higher as indicated by the ● in FIG. 9E is as follows.

When $hm/\lambda=2\%$, and $h1/\lambda=55\%$, $153°\leq\theta\leq157°$

When $hm/\lambda=2\%$, and $h1/\lambda=60\%$, $161°\leq\theta\leq165°$

When $hm/\lambda=3\%$, and $h1/\lambda=55\%$, $157°\leq\theta\leq159°$

When $hm/\lambda=3\%$, and $h1/\lambda=60\%$, $163°\leq\theta\leq167°$

When $hm/\lambda=4\%$, and $h1/\lambda=55\%$, $159°\leq\theta\leq163°$

FIG. 9F is a chart showing propagation characteristics for the boundary acoustic wave obtained by simulation, when $\delta=0.04$ and $h\Delta=hm$. The range where both the series resonant Q and the parallel resonant Q are 10,000 or higher as indicated by the * in FIG. 9F is as follows.

When $hm/\lambda=2\%$, and $h1/\lambda=55\%$, $159°\leq\theta\leq161°$

When $hm/\lambda=3\%$, and $h1/\lambda=55\%$, $159°\leq\theta\leq161°$

The evaluation points in FIG. 9A through FIG. 9F are dispersed but the Q values consecutively change relative to these parameters so a Q value can easily be found by interpolation even between the evaluation points.

If using a film-forming device capable of controlling the film quality to form silicon oxide film, then the density loss rate δ of this SiO2 film can be sufficiently reduced or in other words can be made essentially zero when producing the acoustic wave device of this invention. In this case, using a theta (θ) YX-LN substrate of $149°\leq\theta\leq171°$ eliminates the need to control the boundary undulation quantity hΔ. Namely, by optimizing the easily controllable silicon oxide film 5 thickness h1 and the electrode finger 3 film thickness hm, a boundary acoustic wave with both a series resonant Q and a parallel resonant Q of 10,000 or higher can be obtained, and an acoustic wave device of satisfactory quality can be provided. An optimum silicon oxide film 5 thickness h1 and the electrode finger 3 film thickness hm value depends on the undulation quantity hΔ of the boundary 7, however that value will be within a range of $47.5\%\leq h1/\lambda\leq77.5\%$ as well as $0.01\%\leq hm/\lambda\leq7\%$.

On the other hand, when using a θ YX-L single crystalline piezoelectric substrate of θ<149° or 171°<0, the silicon oxide film 5 thickness h1 and electrode finger 3 film thickness hm might not be optional, or might not even be present depending on the hΔ. In the prior case, a boundary acoustic wave device with an extremely high Q cannot be obtained, and in the latter case the hΔ must be controlled which makes production difficult.

Silicon oxide film 5 formed by low-cost sputtering devices in widespread use might have a density loss δ that deteriorated down to approximately 0.02. In this case, utilizing the theta (θ)YX-LN single crystalline piezoelectric substrate 1 of 153°≦θ≦165° eliminates the need to control the undulation quantity hΔ of boundary 7. An aluminum nitride film can in other words be formed on the surface of the silicon oxide film 5 without using a planarizing process to smooth the undulation quantity hΔ on the surface of silicon oxide film 5. By optimizing the film thickness h1 of the easy to control silicon oxide film 5 and film thickness hm of electrode finger 3 in this way, a boundary acoustic wave of 10,000 or higher for both a series resonant Q and parallel resonant Q can be obtained, and a good quality acoustic wave device can be provided. An optimal film thickness h1 for silicon oxide film 5 and film thickness hm for electrode finger 3 depends on the undulation quantity hΔ of the boundary 7, however this value is the ranges of 52.5%≦h1/λ≦67.5% as well as 1%≦hm/λ≦7%.

On the other hand, when using a θ YX-LN single crystalline piezoelectric substrate 1 where θ<153° or 165°<θ, there might not be an optimal silicon oxide film 5 thickness and electrode finger 3 film thickness, or might not be present depending on the hΔ. In the prior case, a boundary acoustic wave device with an extremely high Q cannot be obtained, and in the latter case the hΔ must be controlled which makes production difficult.

A boundary acoustic wave is present even on the outer side of the range shown in FIG. 9A through FIG. 9F, at 149°≦θ≦171°, and at 47.5%≦h1/λ≦77.5%, as well as at 1%≦hm/λ≦7% and, a high Q value from several thousand to about 10,000 or higher is shown for both the series resonant Q and parallel resonant Q.

Moreover, PCVD (plasma-controlled chemical vapor deposition) equipment forms the film at a fast speed and lowers the cost of the process for forming the silicon oxide film 5. However the silicon oxide film 5 density loss δ might sometimes deteriorate down to approximately 0.04. In this case, utilizing θ YX-LN single crystalline piezoelectric substrate 1 of 159°≦θ≦161° eliminates the need to control the undulation quantity hΔ on the boundary 7. In other words, by optimizing the film thickness h1 of the easy to control silicon oxide film 5 and film thickness hm of electrode finger 3 in this way, a boundary acoustic wave of 10,000 or higher for both a series resonant Q and parallel resonant Q can be obtained, and a good quality acoustic wave device can be provided. An optimal film thickness h1 for silicon oxide film 5 and film thickness hm for electrode finger 3 depends on the undulation quantity hΔ of the boundary 7, however this value is the ranges of 52.5%≦h1/λ≦57.5% as well as 1%≦hm/λ≦5%.

On the other hand, when using a θ YX-LN single crystalline piezoelectric substrate 1 where θ<159° or 161°<θ, there might not be an optimal silicon oxide film 5 thickness and electrode finger film thickness, or might not be present depending on the hΔ. In the prior case, a boundary acoustic wave device with an extremely high Q value cannot be obtained, and in the latter case the hΔ must be controlled which makes production difficult.

Summing up the above, an acoustic wave device includes: a first medium of lithium niobate single piezoelectric crystalline as the main constituent and having a flat surface cut out in a theta (θ) rotated Y cut; and a third medium of aluminum nitride as the main constituent; and a second medium of silicon oxide as the main constituent, enclosed by the first medium and the third medium; and an IDT containing aluminum as the main constituent and formed at the boundary between the second medium and the first medium and the IDT mainly excites the boundary acoustic waves; and when the wavelength of the boundary acoustic wave is set as lambda (λ), the IDT thickness as hm, and the second medium thickness as h1, then:

149°≦θ≦171°, and moreover 47.5%≦h1/λ≦77.5%, and, 0.01≦hm/λ≦0.07.

An acoustic wave device that is easy to manufacture and possesses a high quality factor can in this way be provided. Moreover, the hollow package can be eliminated because boundary acoustic waves are utilized, and silicon oxide can be used as a temperature-compensating film so that a compact acoustic wave device with excellent temperature stability can be provided.

Controlling the hΔ to essentially zero requires implementing a polishing process to planarize the surface of the silicon oxide film 5, however this process is comparatively easy to perform. Silicon oxide film formed by a film-forming device capable of controlling the film quality, exhibited a Q value of 10,000 or higher for both series resonant Q and parallel resonant Q for the δ, hΔ, hm/λ, h1/λ, and θ as shown below.

1.0%≦hm/λ<2.5%, 58.75%≦h1/λ<61.25%, 151°≦θ≦159°

1.0%≦hm/λ<2.5%, 61.25%≦h1/λ<63.75%, 154≦θ≦162°

1.0%≦hm/λ<2.5%, 63.75%≦h1/λ<66.25%, 157°≦θ≦165°

1.0%≦hm/λ<2.5%, 66.25%≦h1/λ<68.75%, 160°≦θ≦168°

1.0%≦hm/λ<2.5%, 68.75%≦h1/λ<71.25%, 163°≦θ≦171°

1.0%≦hm/λ<2.5%, 71.25%≦h1/λ<73.75%, 165°≦θ≦170°

1.0%≦hm/λ<2.5%, 73.75%≦h1/λ<76.25%, 167°≦θ≦169°

2.5%≦hm/λ<3.5%, 58.75%≦h1/λ<61.25%, 153°≦θ≦161°

2.5%≦hm/λ<3.5%, 61.25%≦h1/λ<63.75%, 156°≦θ≦164°

2.5%≦hm/λ<3.5%, 63.75%≦h1/λ<66.25%, 159°≦θ≦167°

2.5%≦hm/λ<3.5%, 66.25%≦h1/λ<68.75%, 161°≦θ≦169°

2.5%≦hm/λ<3.5%, 68.75%≦h1/λ<71.25%, 163°≦θ≦171°

3.5%≦hm/λ<5.0%, 53.75%≦h1/λ<56.25%, 149°≦θ≦151°

3.5%≦hm/λ<5.0%, 56.25%≦h1/λ<58.75%, 152°≦θ≦156°

$3.5\% \leq hm/\lambda < 5.0\%$, $58.75\% \leq h1/\lambda < 61.25\%$,
$155° \leq \theta \leq 161°$ $3.5\% \leq hm/\lambda < 5.0\%$, $61.25\% \leq h1/\lambda < 63.75\%$,
$158° \leq \theta \leq 164°$ $3.5\% \leq hm/\lambda < 5.0\%$, $63.75\% \leq h1/\lambda < 66.25\%$,
$161° \leq \theta \leq 167°$ $3.5\% \leq hm/\lambda < 5.0\%$, $66.25\% \leq h1/\lambda < 68.75\%$,
$163° \leq \theta \leq 168°$ $3.5\% \leq hm/\lambda < 5.0\%$, $68.75\% \leq h1/\lambda < 71.25\%$,
$165° \leq \theta \leq 169°$ $5.0\% \leq hm/\lambda < 7.0\%$, $53.75\% \leq h1/\lambda < 56.25\%$,
$153° \leq \theta \leq 159°$ $5.0\% \leq hm/\lambda < 7.0\%$, $56.25\% \leq h1/\lambda < 58.75\%$,
$156° \leq \theta \leq 162°$ $5.0\% \leq hm/\lambda < 7.0\%$, $58.75\% \leq h1/\lambda < 61.25\%$,
$159° \leq \theta \leq 165°$ $5.0\% \leq hm/\lambda < 7.0\%$, $61.25\% \leq h1/\lambda < 63.75\%$,
$161° \leq \theta \leq 167°$ $5.0\% \leq hm/\lambda < 7.0\%$, $63.75\% \leq h1/\lambda < 66.25\%$,
$163° \leq \theta \leq 169°$ These characteristics resemble those characteristics for the case where $h\Delta=0$ shown in FIG. 9A. For example, $1.0\% \leq hm/\lambda < 2.5\%$ corresponds to $hm/\lambda=2\%$ in FIG. 9A; and $58.75\% \leq h1/\lambda < 61.25\%$ corresponds to $h1/\lambda < 60\%$ in FIG. 9A, and $151° \leq \theta \leq 159°$ was obtained which is the same result as in FIG. 9A.

The crystalline orientation of the C axis of the aluminum nitride film 6 is preferably made random. This random orientation does not convert the SH (shear horizontal) wave component which is the main constituent of the mechanical oscillation generated by the IDT 14 into a SV (shear vertical) wave component within the aluminum nitride film. Absolutely the same effect will be rendered even on film in an amorphous state. Moreover, the same effect can be obtained even for oriented film or single crystalline film even when the C axis of aluminum nitride film is largely perpendicular to the substrate surface, because the SV component and SH component intersect. The same effect is also rendered in silicon oxide film.

Figure 10:
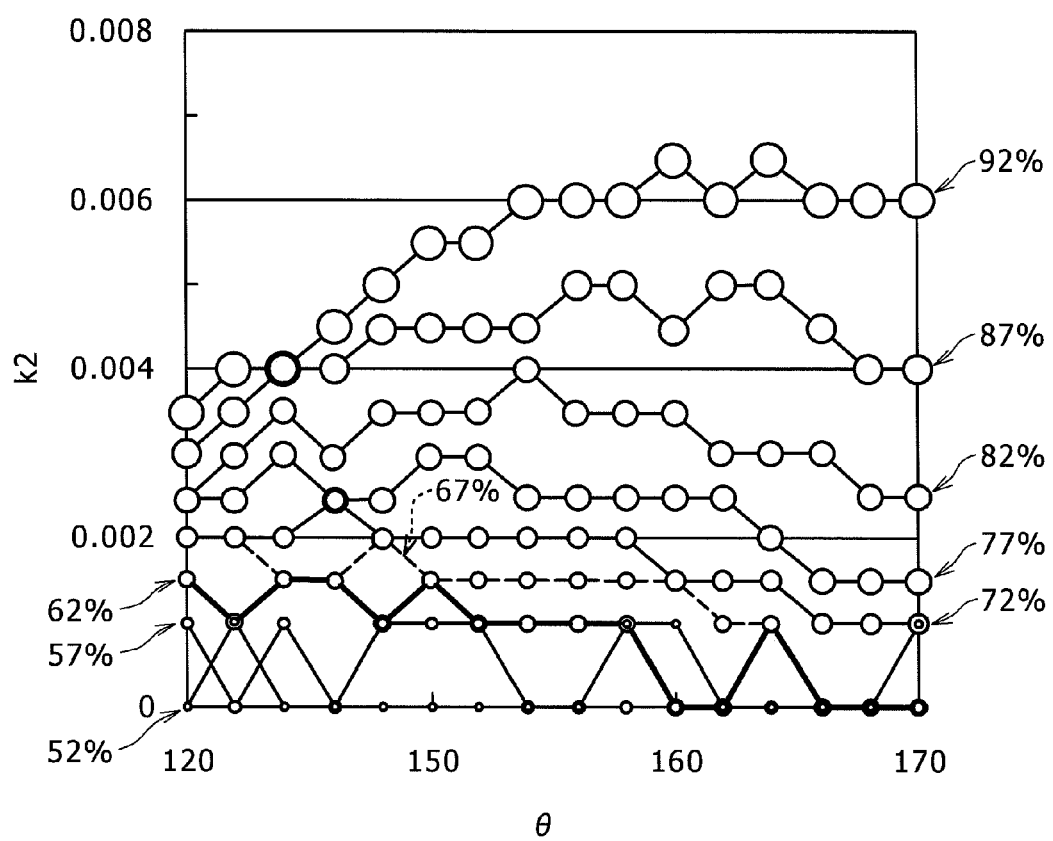
FIG. 10 is a graph showing the relation of the cut angle theta (ν), and excitation intensity K2 of the slow shear wave type bulk waves with the ratio of the sum of the wavelength-converted IDT film thickness and silicon oxide film thickness, in an enlarged section of a 140° to 170° cut angle theta (θ) in the first embodiment.

The cut angle θ is therefore preferably made $149° \leq \theta \leq 171°$ when the thickness of the second medium is h1, and the IDT thickness is set as hm, in order to provide an acoustic wave device that is easy to manufacture and possesses a high quality factor. FIG. 10 shows the excitation intensity of the slow shear wave type bulk wave generated on the low frequency side of the series resonant frequency when the cut angle θ is within this range. When the cut angle θ is restricted to $149° \leq \theta \leq 171°$, reducing the sum of the film thickness of IDT 14 and silicon oxide film 5, or in other words, (h1+hm)/λ to 77% or lower, can reduce the k2 of the slow shear wave type bulk waves to 0.3% or lower. Moreover, the k2 of the slow shear wave type bulk waves can be lowered to 0.15% or less by reducing the sum of the film thickness of IDT 14 and silicon oxide film 5, to 62% or lower of the wavelength. To restate this description in other words, an acoustic wave device with no spurious acoustic waves can be provided.

When h2/2 is smaller than λ, mechanical oscillation energy is present on the surface of the aluminum nitride film 6 so the surface acoustic waves are excited in this case. These surface acoustic waves have extremely small mechanical oscillation energy on the surface compared to conventional surface acoustic waves and therefore possess some boundary acoustic wave properties. There is for example, no deterioration in electrical characteristics due to losses from impurities adhering to the surface, or damage on the aluminum nitride film 6 surface due to mishandling or frequency deviations, etc. Applying the present invention to surface acoustic wave devices can therefore provide an acoustic wave device with higher reliability than the conventional surface acoustic wave devices. However propagation losses gradually increase as the dimensions become thinner, so the resonator should preferably be made sufficiently thick.

An easy to manufacture acoustic wave device possessing a high quality factor (device Q value) can therefore be achieved even in cases where a sufficient desired film thickness and flatness cannot be provided, by clearly specifying a cut angle θ capable of attaining a high device Q value by correcting the film thickness. The present embodiment for example can be applied to acoustic wave devices possessing a GHz-band pass band for high-frequency filters and high-frequency resonators that must be easy to manufacture and possess a high quality factor (device Q value).

Second Embodiment

Figure 11:
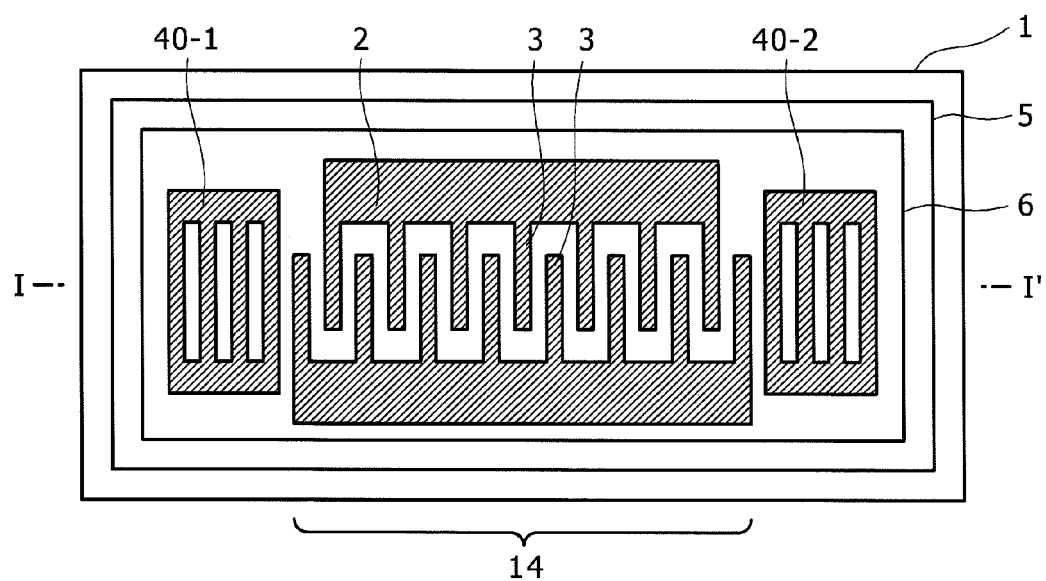
FIG. 11 is a pattern diagram from an upper view for describing the boundary acoustic wave device of a second embodiment of the present invention.
Figure 12:
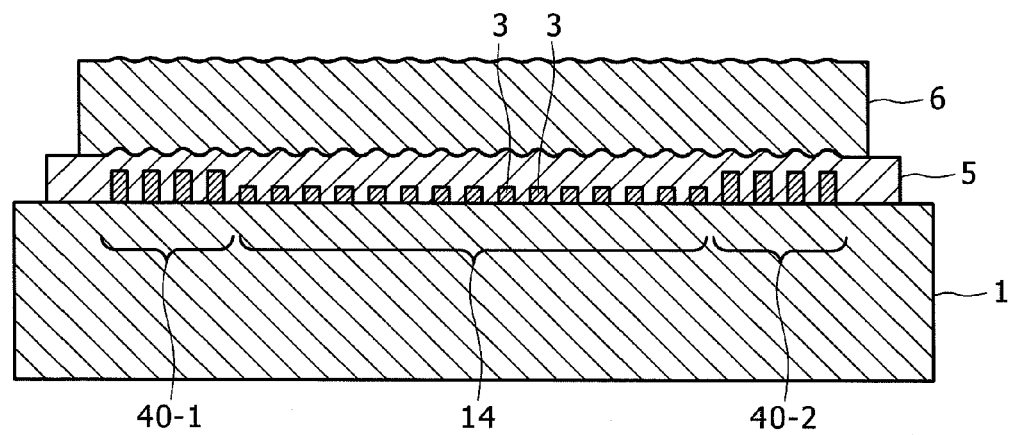
FIG. 12 is a vertical cross sectional pattern diagram for describing the boundary acoustic wave device of the second embodiment of the present invention.
Figure 13:
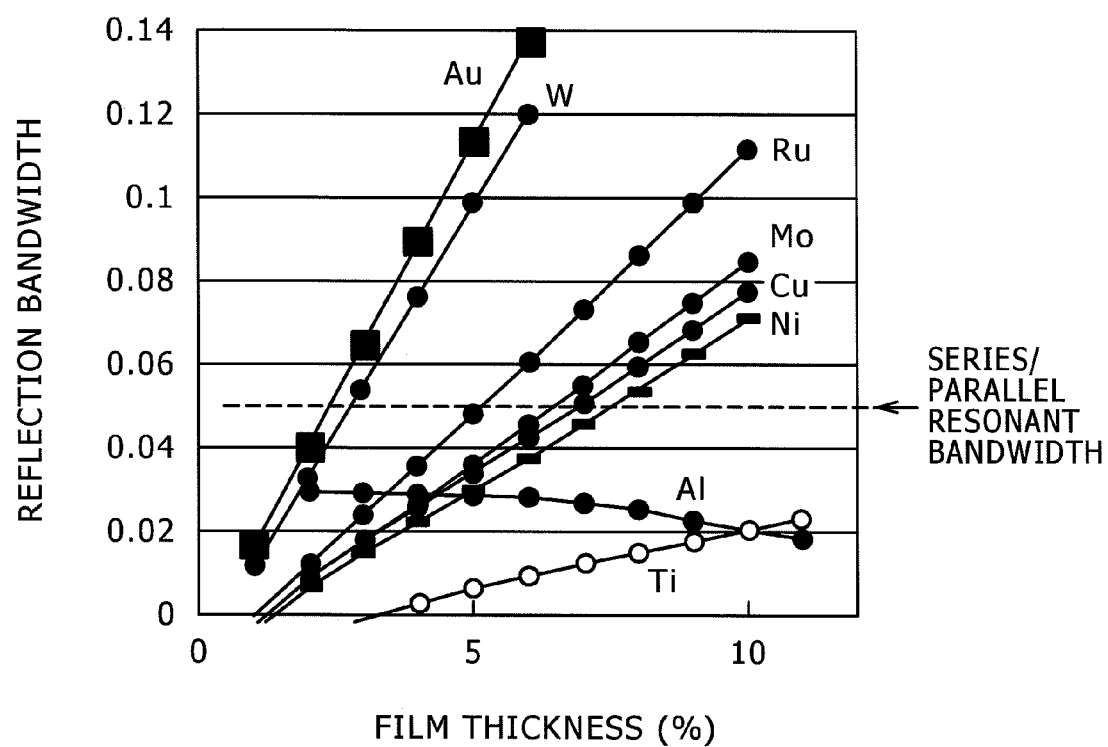
FIG. 13 is a graph showing the material dependence of the effective reflection bandwidth of the reflector in the second embodiment.

A second embodiment of the boundary acoustic wave device of the present invention is described next while referring to FIG. 11 through FIG. 13. FIG. 11 is a pattern diagram from an upper view for describing the boundary acoustic wave device of the second embodiment. FIG. 12 is a cross sectional pattern diagram for describing the boundary acoustic wave device of the second embodiment, taken along the cross section I-I'0 in FIG. 11. FIG. 13 is a graph showing the material dependence of the effective reflection bandwidth of the reflector 4 in the second embodiment.

The reflector 40 of piezoelectric boundary acoustic wave device of the present embodiment differs from that of the first embodiment. Namely, the reflectors 40 formed mainly as a metal film with a film thickness of 8% of the wavelength and copper as the main constituent are mounted on both sides of the IDT 14. The line width and gap of the reflectors 40 are respectively set 8% smaller than those of the IDT 14.

The inventors took note of the fact that the leaky boundary acoustic wave has a faster acoustic velocity than the boundary acoustic waves described in WO2005/069485 and WO2006/114930, and made a detailed investigation of methods for efficiently trapping the boundary acoustic waves into the IDT 14. This investigation revealed that the method can be implemented for trapping the leaky boundary acoustic waves in the IDT 14, which described in WO2005/069485 and WO2006/114930 as the main acoustic waves in the reflector 40. In other words, the reflector in the second embodiment utilizes a large density metal so that the acoustic modes in the IDT 14 and reflector 40 are different and therefore it was perceived that almost all of the leaky boundary acoustic wave is reflected at the boundary between the IDT 14 and reflector 40. Moreover, a portion of the leaky acoustic waves undergo a mode change to boundary acoustic waves in the WO2005/069485 and WO2006/114930 and penetrate into the reflector, however the line width and gaps of the reflector 40 are set respectively 8 percent smaller than the IDT 40. The IDT series/parallel resonant frequency matches the reflection band of the reflector so that the boundary acoustic waves penetrating into the reflector 40 are internally reflected by the reflector 40, and return to the IDT. Described in other words, the reflector 40 shown by the second embodiment possesses a sufficiently large reflection factor relative to leaky boundary acoustic waves and an acoustic wave device with low propagation loss can therefore be provided.

The reflector 40 must possess a sufficiently wide effective reflection band width. The effective reflection bandwidth here is a frequency bandwidth with a high reflection factor and also whose reflection factor frequency characteristics contain no spurious waves. This effective reflection bandwidth is sufficiently larger than variations in the reflection bandwidth center frequency caused by variations or irregularities in the reflector film thickness/patterning dimensions, and unlike the IDT is not vulnerable to adverse effects on electrical characteristics even if it utilizes a heavy metal.

FIG. 13 is a drawing showing the interval between the series/parallel resonant frequencies in the figure. The reflector 40 is made up of metal layers whose main constituent is metal with a density larger than 4500 kg/m$^3$ such as gold, tungsten, ruthenium, molybdenum, copper, and nickel (Au, W, Ru, Mo, Cu, and Ni). All of these materials generated slow shear wave type bulk waves of lithium niobate as spurious acoustic waves within the reflection band. The effective reflection bandwidth is therefore set as the wider part of the reflection bandwidth divided into two regions by spurious waves. In contrast to aluminum where the effective reflection bandwidth descends to the lower right, metals with a density larger than 4500 kg/m$^3$ ascend to the upper right. This state reveals that using materials with a density larger than 4500 kg/m$^3$ allows enlarging the effective reflection bandwidth more than the series/parallel resonant frequency bandwidth. Restated in other words, the reflector 40 of the second embodiment possesses an even larger reflection factor. An acoustic wave device with even smaller propagation loss can therefore be provided.

Third Embodiment

Figure 14:
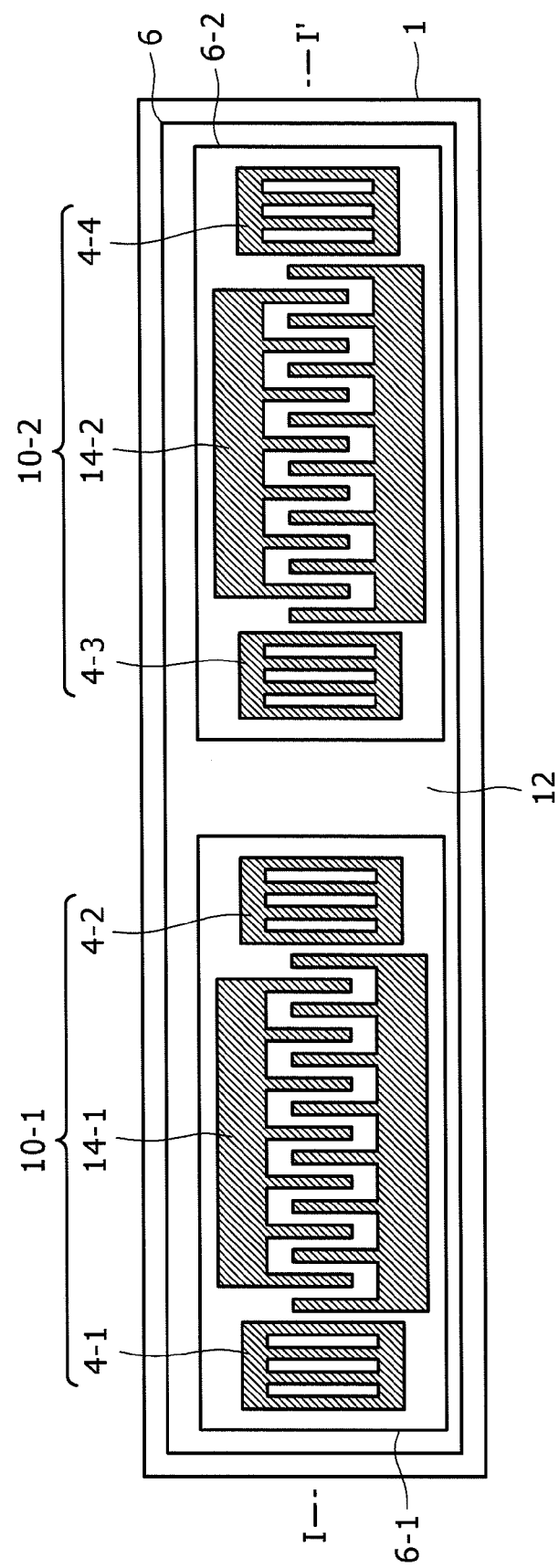
FIG. 14 is a pattern diagram from an upper view for describing the boundary acoustic wave device of a third embodiment of the present invention.
Figure 15:
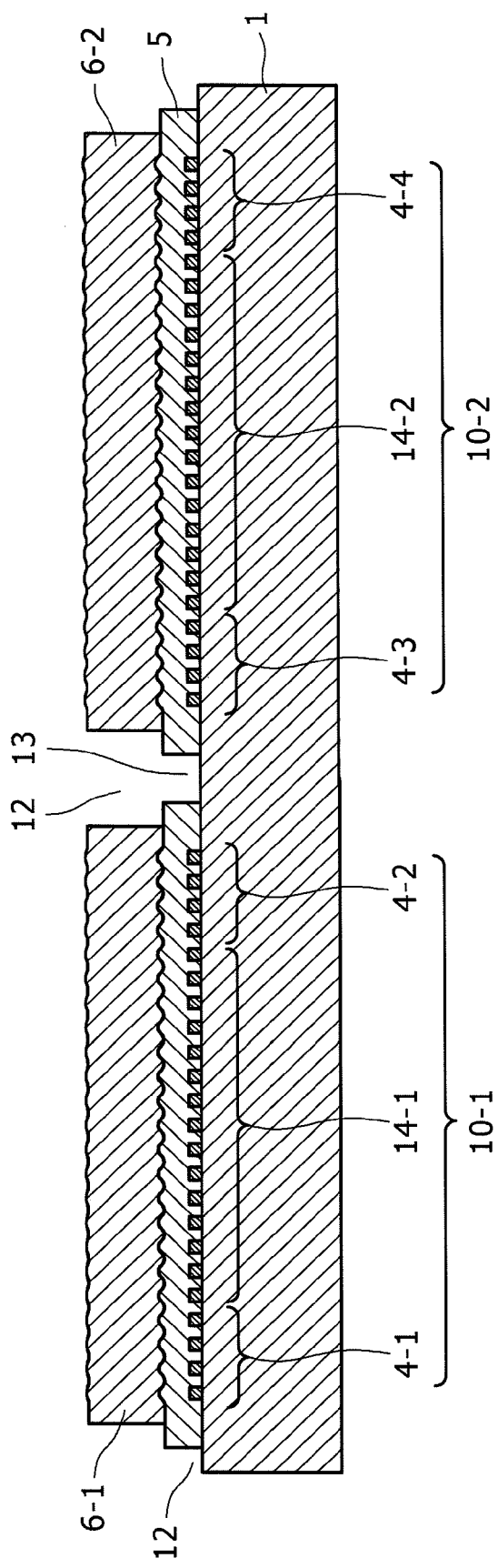
FIG. 15 is a vertical cross sectional pattern diagram for describing the boundary acoustic wave device of the third embodiment of the present invention.

A third embodiment of the boundary acoustic wave device of the present invention is described next while referring to FIG. 14 through FIG. 15. FIG. 14 is a pattern diagram from an upper view for describing the boundary acoustic wave device of the third embodiment. FIG. 15 is a cross sectional pattern diagram of the boundary acoustic wave device of the third embodiment and is taken along lines I-I' of FIG. 14.

The boundary acoustic wave device of the present embodiment which is made up of a one-port resonator in two sections, employs a structure for each resonator (10-1, 10-2) as shown in the first embodiment. Namely, the IDT14 is patterned from a metal film whose main constituent is aluminum on the surface of a θ YX-LN single crystalline piezoelectric substrate 1. The silicon oxide film 5 is formed at a film thickness h1 on the IDT14. An aluminum nitride film 6 is formed at a film thickness h2 on the surface of this silicon oxide film 5.

A portion of the boundary acoustic waves excited in the resonator, leak outside the resonator and are reflected at the ends of the θ YX-LN single crystalline piezoelectric substrate 1. These reflected boundary acoustic waves return once again to the resonator and generate spurious responses that adversely affect the electrical characteristics. In this third embodiment, a region 12 is formed between the resonators (10-1, 10-2) or between the resonator and the edge of piezoelectric substrate 1 where there is no aluminum nitride film 6, or in other words on the upper surface of the piezoelectric substrate 1 and the silicon oxide film 5 not covered by the aluminum nitride film 6. Moreover, a region 13 is also formed on the piezoelectric substrate 1 where there is no silicon oxide film 5. In other words, an acoustic insulation region forming half or less the film thickness of IDT14 is formed to at least the thickness of either the second medium 5 or the third medium 6, on a section other than the IDT14, when the wavelength of the boundary acoustic wave is lambda λ.

The boundary acoustic waves in these regions 12, 13 are transmitted as leaky boundary waves having large propagation loss and therefore the acoustic energy inside the piezoelectric substrate 1 is scattered and lost. These regions 12, 13 therefore function as acoustic insulation regions, and consequently render the effect of preventing adverse effects from edge reflection.

The same effect can be achieved in the region 12 even without completely stripping away the aluminum nitride film 6, by thinning it by λ/2. However the greater the thinning, the stronger the effect so the film is preferably stripped away completely. Adding resin to the acoustic insulation region allows the resin to absorb the acoustic energy so that the effect can be further enhanced. In other words, applying a resin mold on the upper surface of the aluminum nitride film 6, the upper side of the regions 12, 13, and outer edge of the silicon oxide film 5 and the outer edges of the piezoelectric substrate 1 renders an acoustic absorbing effect.

Fourth Embodiment

Figure 16:
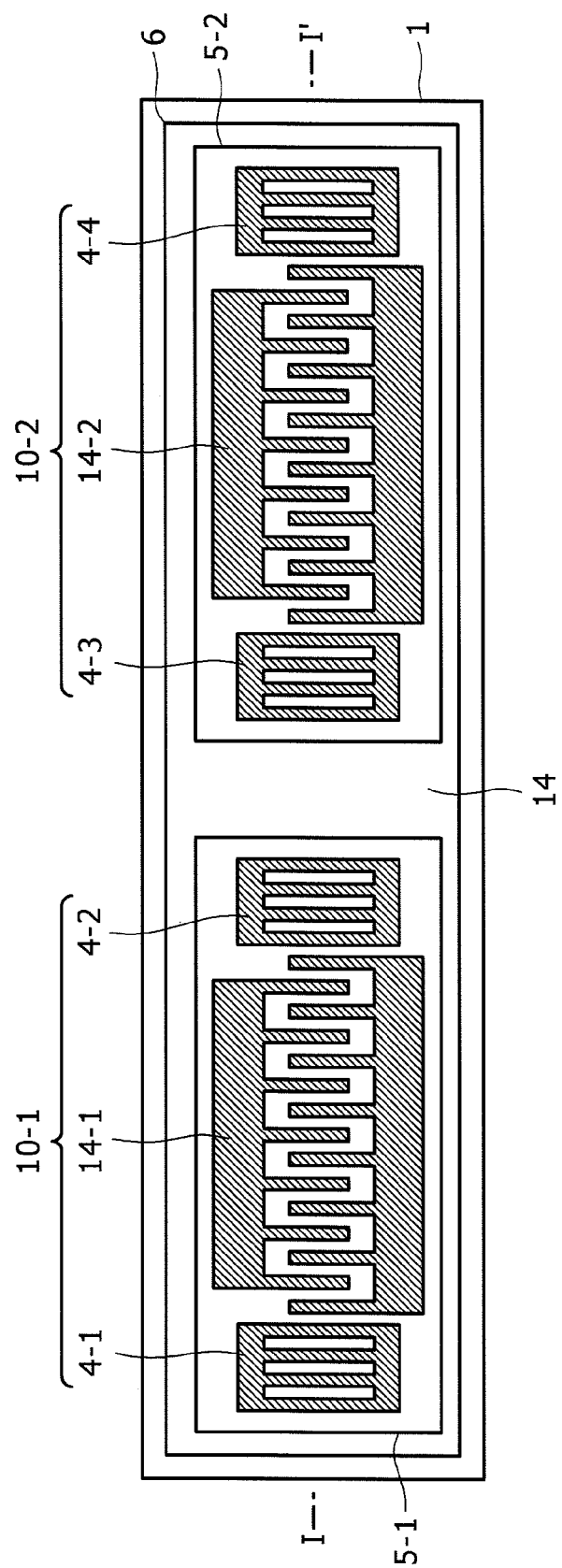
FIG. 16 is a pattern diagram from an upper view for describing the boundary acoustic wave device of a fourth embodiment of the present invention.
Figure 17:
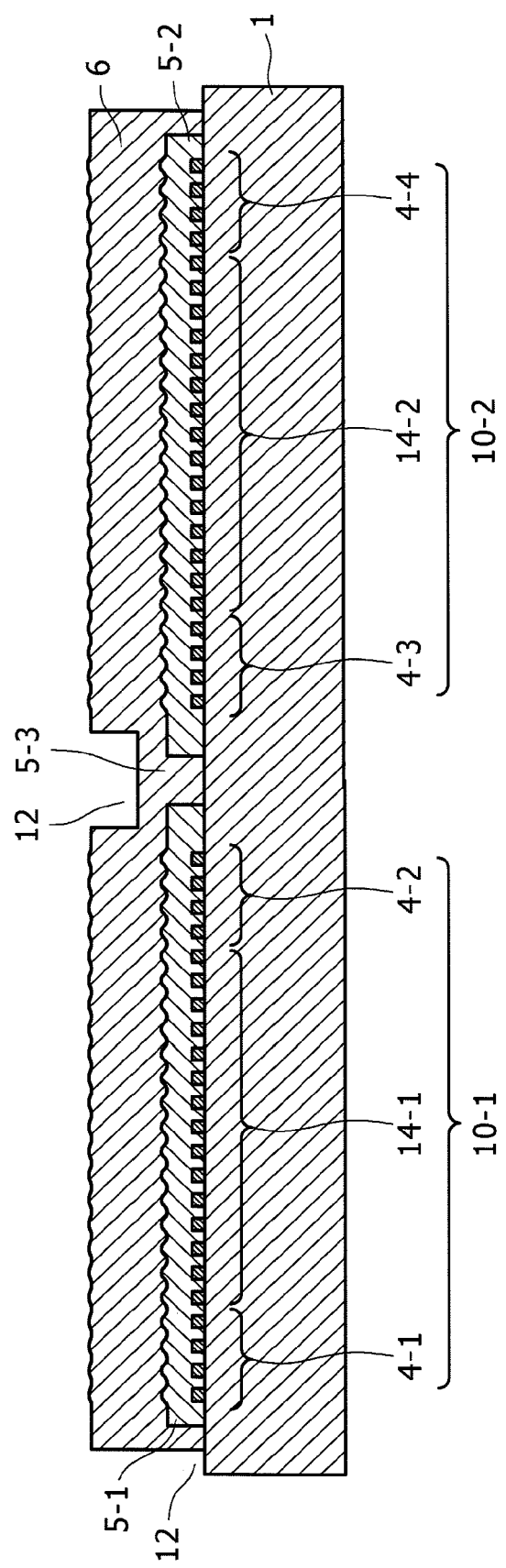
FIG. 17 is a vertical cross sectional pattern diagram for describing the boundary acoustic wave device of the fourth embodiment of the present invention.

The acoustic insulation region can be formed by adjusting the film thickness of the silicon oxide film 5. The boundary acoustic wave device of the fourth embodiment of this invention is described next while referring to FIG. 16 through FIG. 18. FIG. 16 is a pattern diagram of an upper view for describing the boundary acoustic wave device of the fourth embodiment. FIG. 17 is a cross sectional pattern diagram for describing the boundary acoustic wave device of the fourth embodiment, and is taken along lines I-I' of FIG. 16. In this embodiment, the boundary acoustic wave device is made up of a one-port resonator in two sections, and each resonator is the same as in the first embodiment. Namely, the IDT14 is patterned as a metal film whose main constituent is aluminum on a θ YX-LN single crystalline piezoelectric substrate 1. The silicon oxide film 5 is formed at a thickness h1 on the IDT14. An aluminum nitride film 6 is formed at a film thickness h2 on the surface of this silicon oxide film 5.

A portion of the boundary acoustic waves excited in the IDT14, leak outside the resonator. When the leakage energy of the resonator 10-1 reaches the resonator 10-2, it generates spurious responses that adversely affect the electrical characteristics of the boundary acoustic wave device. In this fourth embodiment, a thin region 5-3 of silicon oxide film 5 is formed between the resonator 10-1 and the resonator 10-2 as the acoustic insulation region. Namely, when a second medium 5 at thickness of h1a was formed on the IDT 14, a second medium 5 at a thickness of h1b is formed as a thin film of $0 \leq h1b < h1a \div 2$ on at least a portion of the regions other than the IDT14. The thickness of the third medium 6 may be thinned the same as above, without changing the second medium 5 film thickness, or the effect may be increased by thinning the thin region 5-3 as well as the film thickness of region 12 on the aluminum nitride film 6 on the upper side of region 5-3.

Figure 18:
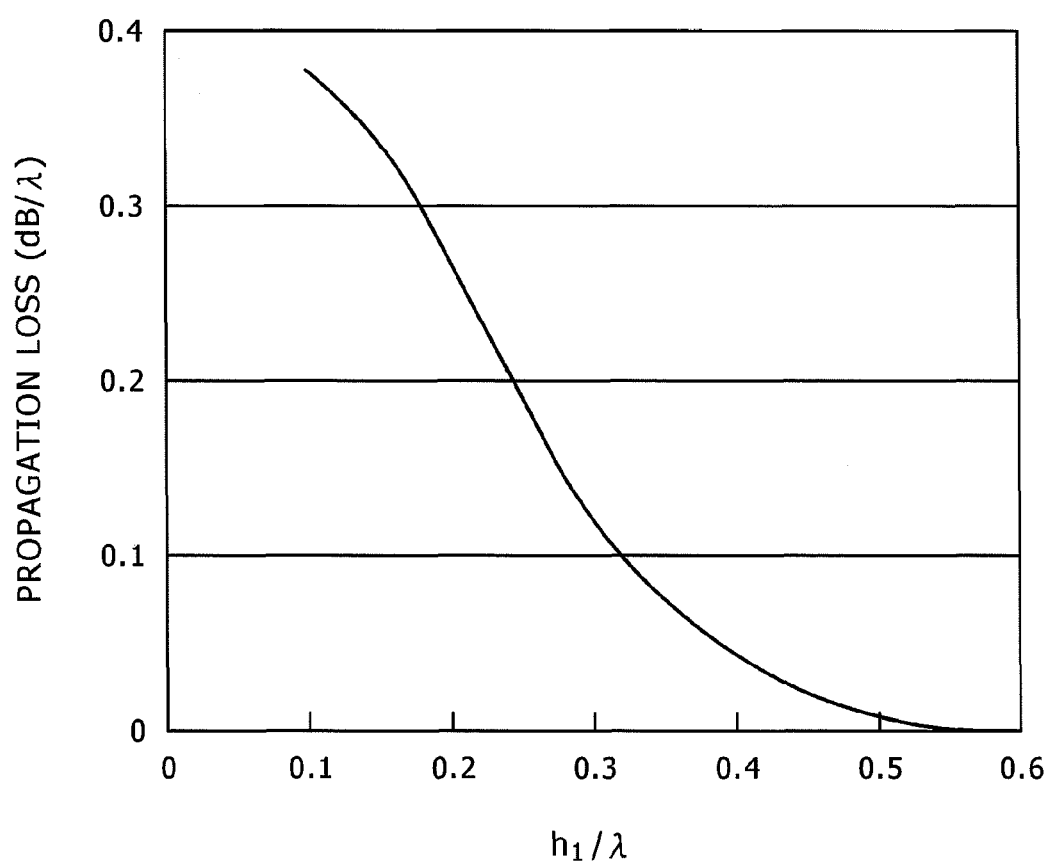
FIG. 18 is a graph for describing propagation loss and wavelength-converted film thickness of the silicon oxide in the fourth embodiment of the present invention.

FIG. 18 is a drawing for describing the relation between propagation loss in the boundary acoustic wave, and the film thickness of silicon oxide film 5 in the acoustic insulation region. The film thickness h1 of silicon oxide film 5 on the resonator 10 region is set to 0.65λ. The film thickness of the thin region 5-3 of the silicon oxide film 5 of the acoustic insulator region is set to half the thickness of other regions (h1=0.325λ) and the distance between the two resonators (10-1, 10-2) is set from 10 to 30 times the wavelength λ for example by setting it to 100 μm to render a 50 dB insulating effect. The acoustic insulating effect can be even further enhanced by making the thin region 5-3 even thinner. In this case also, adding resin onto the acoustic insulating region will allow the resin to absorb the acoustic energy so that an even greater effect can be obtained.

The description in the third and fourth embodiments utilized an aluminum nitride film 6, however the material to be used is not necessarily limited to this material. The same effect can be achieved by a leaky type boundary acoustic wave device formed from two or more mediums and an electrode formed from lithium niobate piezoelectric substrate. Also, instead of using lithium niobate as the main constituent of the first medium, the same effect can be achieved by employing lithium tantalate piezoelectric substrate possessing a flat surface cut out in a θ rotated Y cut.

Fifth Embodiment

Figure 19A:
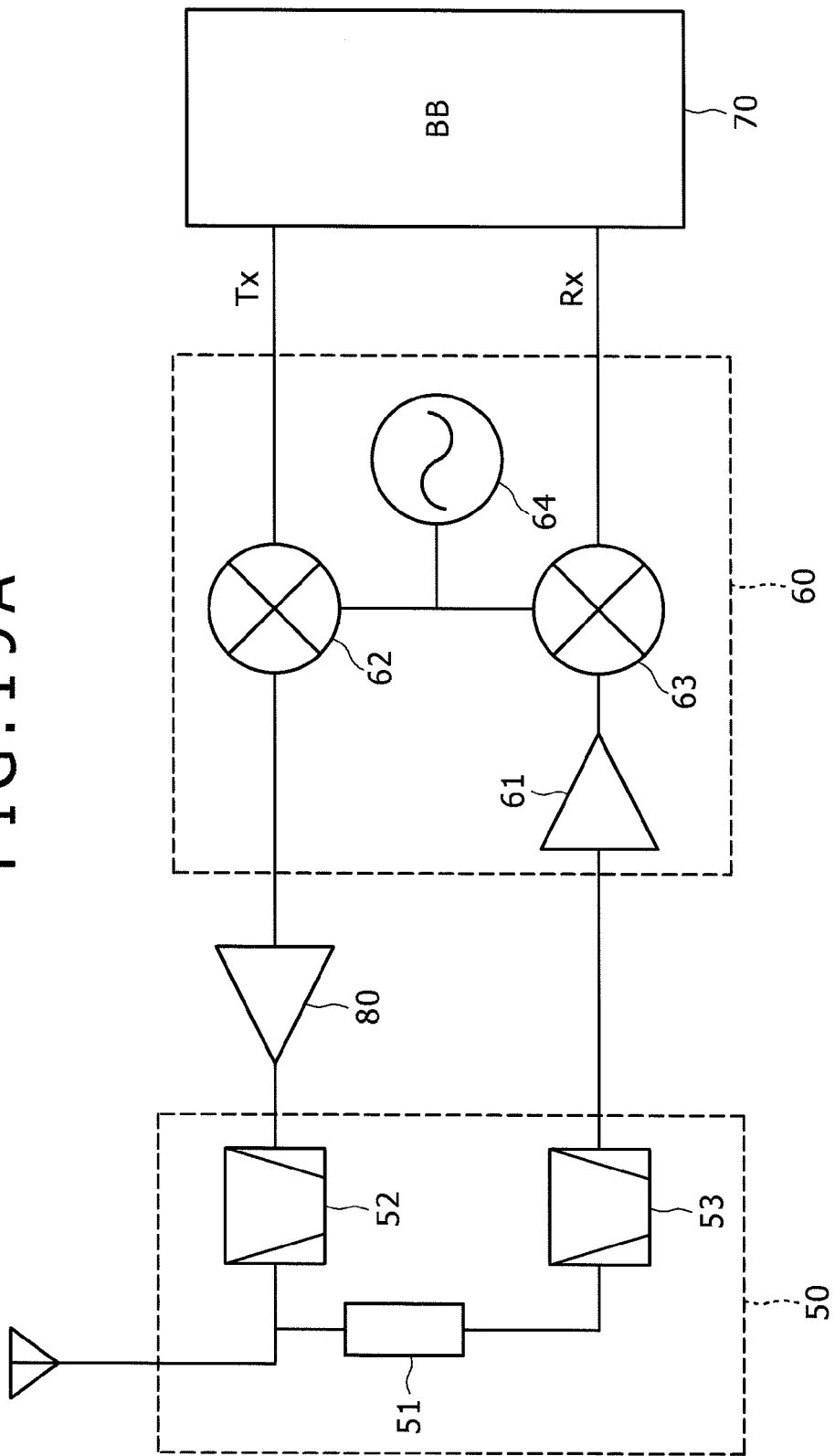
FIG. 19A is a block circuit diagram for describing the front end section making up the high-frequency (RF) filter in a typical cellular telephone in a fifth embodiment of the present invention.
Figure 19B:
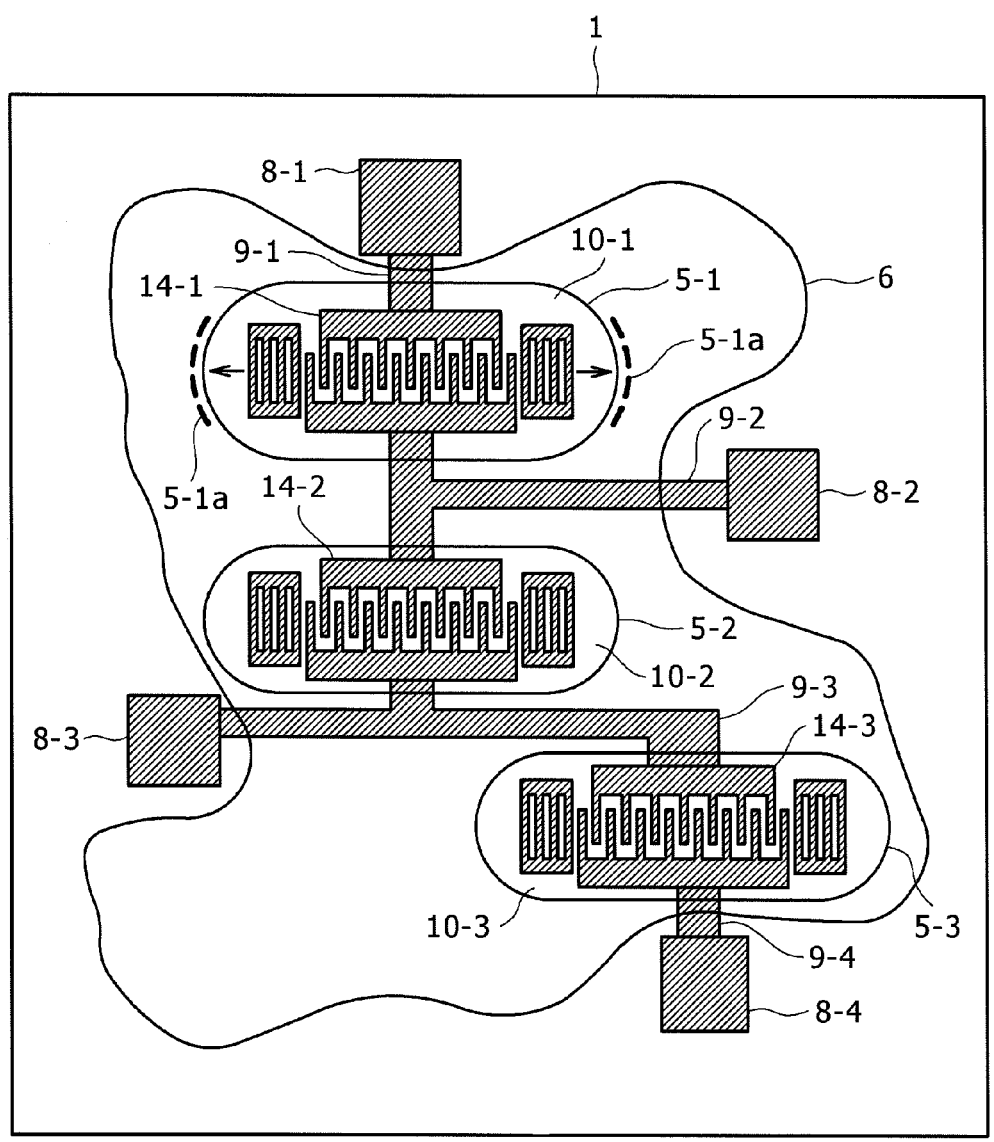
FIG. 19B is an upper view pattern diagram showing an example of the boundary acoustic wave device constituting the high-frequency filter utilized in the front end section of FIG. 19A.

The example in a fifth embodiment describes applying the boundary acoustic wave device of this embodiment of the present invention as a high-frequency (RF) filter for communications equipment such as cellular telephones. FIG. 19A is a circuit block diagram for describing the front end section making up the high-frequency filter in the wireless communication device to which the present invention is applied. FIG. 19B is an upper view pattern diagram showing an example of the boundary acoustic wave device including a high-frequency filter utilized in the wireless communication device of FIG. 19A.

Here, a reference numeral 50 denotes the transmit/receive switcher module connected to the antenna, 60 denotes the high-frequency integrated circuit module, 70 denotes the baseband section, and 80 denotes the power amplifier module. These transmit/receive switcher modules 50, high-frequency integrated circuit module 70, and power amplifier module 80, may be used individually or used integrated together as a module in cellular telephone chipsets. A reference numeral 51 denotes a phase shifter, 52 denotes a transmit bandpass filter, and 53 denotes a receive bandpass filter. Moreover, a reference numeral 61 denotes a low-noise amplifier, 62 denotes a transmit mixer, 63 denotes a receive mixer, and 64 denotes a synthesizer. Each of the boundary acoustic wave devices described in the first embodiment through the fourth embodiment can for example constitute a transmit bandpass filter 52 or the receive bandpass filter 53 by utilizing a ladder type resonator element made up of series resonators and parallel resonators.

In FIG. 19A, the receive signal RX for the high-frequency wave received by the antenna passes through the phase shifter 51 and is input by way of the bandpass filter 53 that only passes frequency signals on a specified receive band, to the low-noise amplifier 61 for amplifying the high-frequency (RF) receive signal Rx. The amplified high-frequency receive signal Rx is sent to a baseband section 70, by way of the receive mixer 63 that converts the signal to a baseband. The transmit signal TX however that was sent from the baseband section 70, passes through the transmit mixer 62 that forms a modulated wireless frequency signal, and is input to the power amplifier module 80. This amplified high-frequency (RF) transmit signal Tx is input to the bandpass filter 52 that only passes transmit signals in a specified transmit frequency band, and is then sent to the antenna and is radiated from the antenna as a radio wave.

Multiple boundary acoustic wave devices can be combined together to configure the respective high-frequency (RF) bandpass filters 52, 53 used in this type of front end section.

The block diagram shown in FIG. 19A was used to describe the case where using a single-band cellular telephone. However, the structure is not limited in particular to the embodiments, and the invention may also apply in the same way to multiband cellular telephone structures including dual band, triple band and quad band, etc. Needless to say, as a high-frequency (RF) signal filter, the boundary acoustic wave device of this invention is applicable not only to bandpass filters, but also to high-frequency filters overall, including low-pass filters and high-pass filters.

FIG. 19B is an upper view pattern diagram showing an example of the boundary acoustic wave device constituting the high-frequency filter in the fifth embodiment. In this embodiment, the three one-port resonators 10-1, 10-2, and 10-3 are mounted on the same theta (θ) YX-LN single crystalline piezoelectric substrate. The actual structure of each resonator is the same as shown in the first embodiment. An acoustic insulator region is formed between the resonators, and between the resonators and edges as shown in FIG. 14 through FIG. 17. In order to prevent boundary acoustic waves reflected from the edges of each silicon oxide film 5 (5-1, 5-2, 5-3) from returning to the resonator, the edges (dashed lines shown at 5-1a) of each silicon oxide film 5 are for example curved so as not to be in parallel with the electrode fingers. Moreover, the curves act to disperse the boundary acoustic waves. The edges of the aluminum nitride film 6 are curved in the same way to prevent the boundary acoustic waves from returning to the resonator.

The boundary acoustic wave device of the present embodiment contains the input/output terminals 8-1, 8-2, 8-3, 8-4, and the lead line 9-4. The input/output terminal 8-1 is for example connected to the output terminal, the terminal 8-2 is connected to ground by way of the inductance L, and the terminal 8-3 is connected to ground by way of the capacitance C, and the terminal 8-4 is connected to the input terminal.

A boundary acoustic wave device that is easy to manufacture and possesses excellent electrical characteristics, or in other words, a high-frequency (RF) transmit bandpass filter 52 and receive bandpass filter 53 can be achieved in this way.

The present invention as described above can provide an easy to manufacture boundary wavelength device with a high quality factor as well as a filter using that device, by utilizing a θ YX-LN single crystalline piezoelectric substrate having a specified cut angle θ. Moreover, a high device Q value can be obtained by correcting the film thickness, even in cases where the specified film quality and flatness cannot be obtained. A boundary acoustic wave device that is easy to manufacture can also be provided. Further, boundary acoustic waves are utilized so that there is no need for ceramic packages and therefore a low-cost acoustic wave device can be provided.

The examples in this invention described an IDT made from aluminum but a similar effect is obtained even if other metals are utilized. However, low-resistance, lightweight metals are able to minimize losses in leaky boundary acoustic waves and therefore the IDT is preferably made from aluminum as the main constituent.

The effect of the present invention is obvious even if a thin film is formed between the aluminum nitride film 6, the silicon oxide film 5, the IDT14 and the θ YX-LN single crystalline piezoelectric substrate. The effect of the invention is rendered even if for example an activator film is formed to boost the sealing between the aluminum nitride film 6 and the silicon oxide film 5.

Sixth Embodiment

Figure 20:
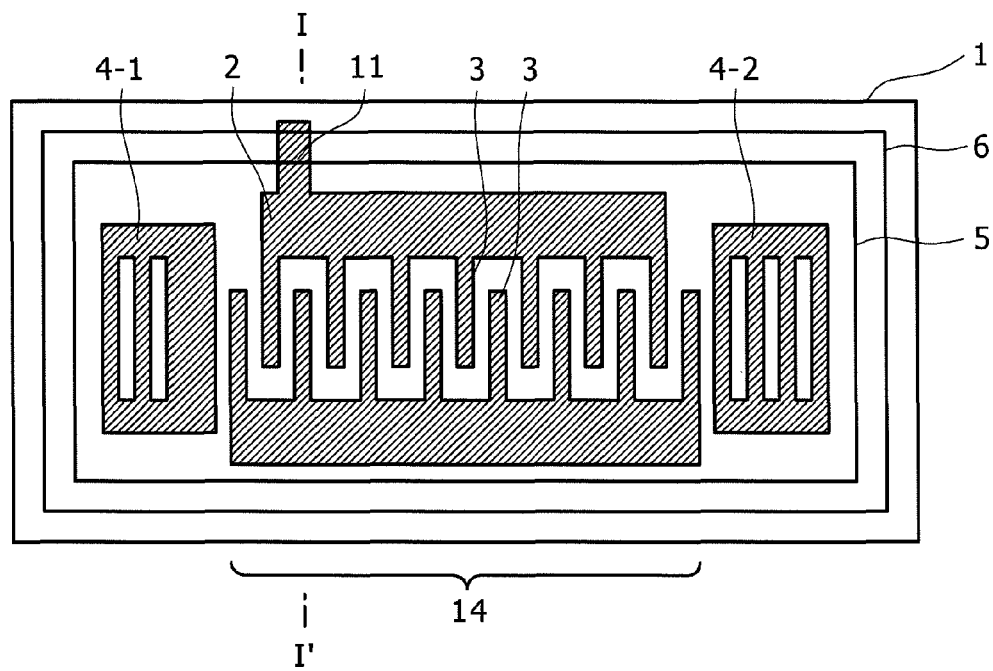
FIG. 20 is an upper view pattern diagram for describing the boundary acoustic wave device of a sixth embodiment of the present invention.
Figure 21:
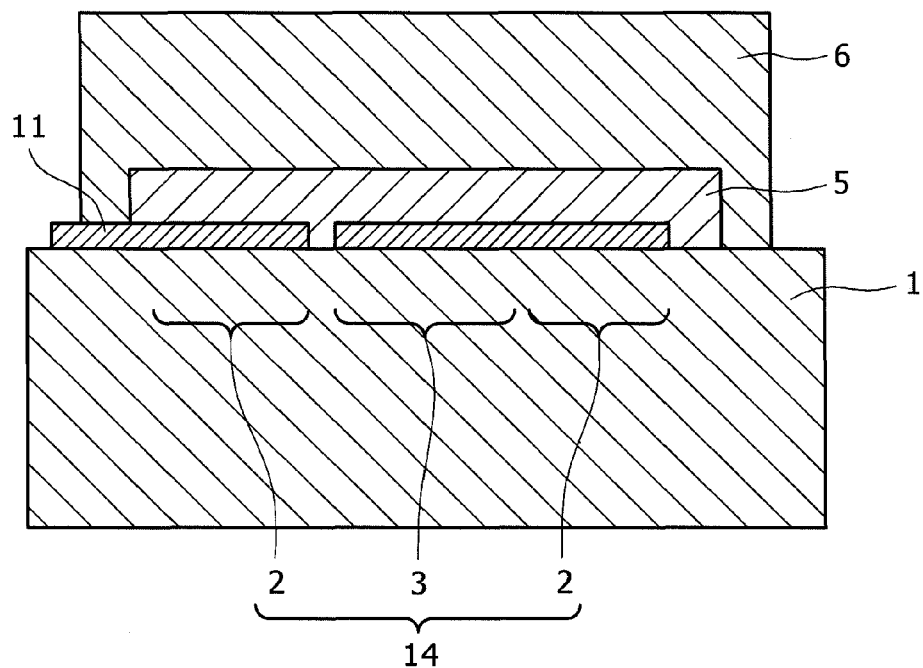
FIG. 21 is a vertical cross sectional pattern diagram for describing the boundary acoustic wave device of the sixth embodiment of the present invention.

FIG. 20 through FIG. 21 are drawings for describing the boundary acoustic wave resonator of a sixth embodiment of the present invention. FIG. 20 is an upper view pattern diagram for describing the boundary acoustic wave resonator of the sixth embodiment. FIG. 21 is a cross sectional pattern diagram for describing the boundary acoustic wave resonator of the sixth embodiment, and is taken along lines I-I' of FIG. 20.

At least a portion of the piezoelectric boundary acoustic wave device of this embodiment includes a heat discharge terminal 11 made from metallic film connected to the IDT formed between the first medium and the second medium. Namely the IDT14 includes a bus bar 2 and electrode fingers 3. The bus bar 2 section is formed as one piece with the heat discharge terminal 11 which is a thin material made for example from metal film and possessing excellent electrical and heat propagation characteristics. A section of this heat discharge terminal 11 is directly connected to the aluminum nitride film 6. The heat emitted by the electrode fingers 3 is dissipated via the heat discharge terminal 11 to the aluminum nitride film 6, which allows lowering the temperature of the IDT14. An acoustic wave device with excellent power tolerance characteristics can therefore be provided. When the thickness of the second medium 5 was set to h1c, then the second medium 5 may be set to a thin film thickness in the region on the metal film corresponding to heat discharge terminal 11, or the region on the metallic film corresponding to the bus bar. Preferably, the relation, $0 \leq h1d \leq h1c/2$ is satisfied when the thickness of the second medium of this section is set to h1d.

In FIG. 20, the IDT14 is directly connected to the aluminum nitride film 6 in the vicinity of the heat discharge terminal 11. However thermal contact can be improved by forming an adhesive layer between the IDT14 and the aluminum nitride film 6. In either of these cases, the thickness of the silicon oxide film 5 in the region corresponding to the heat discharge terminal 11 and the sections of IDT14 in that vicinity must be reduced to half or less that of other sections, and the thickness is more preferably set to zero.

Figure 22:
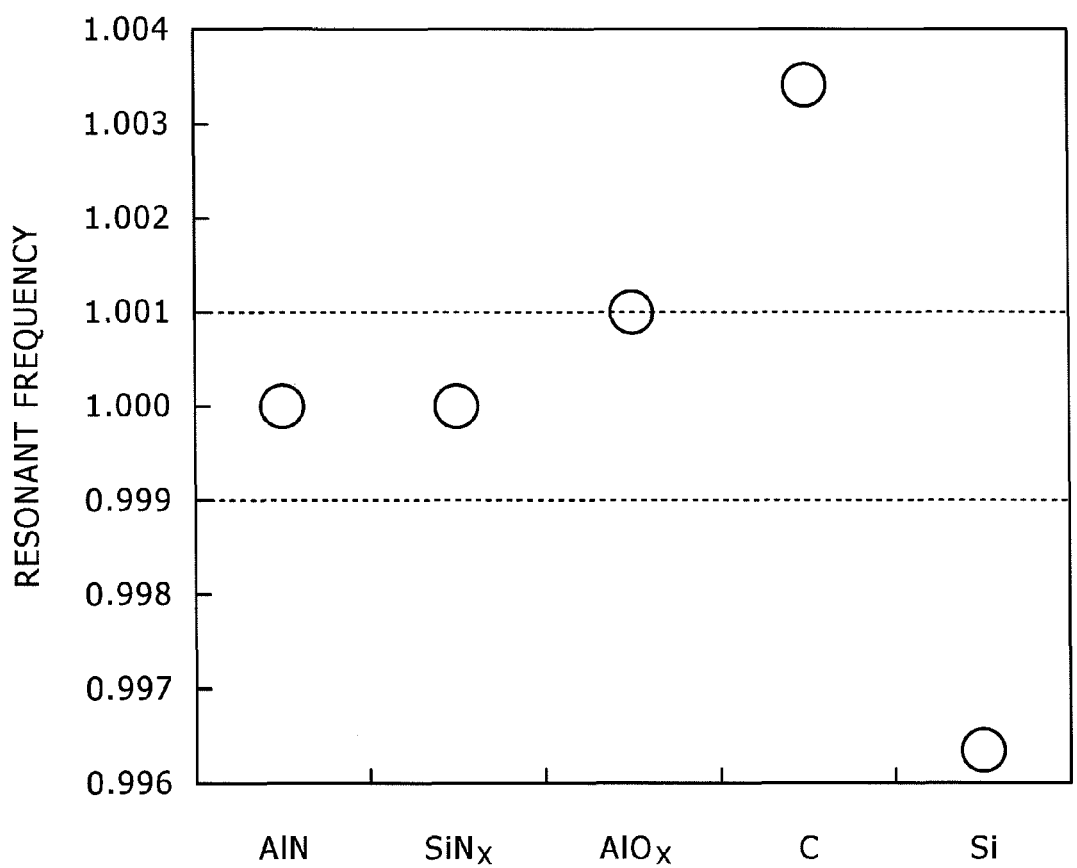
FIG. 22 is a graph for showing the relation of the acoustic wave properties to the medium for sealing the boundary acoustic waves.
Figure 23:
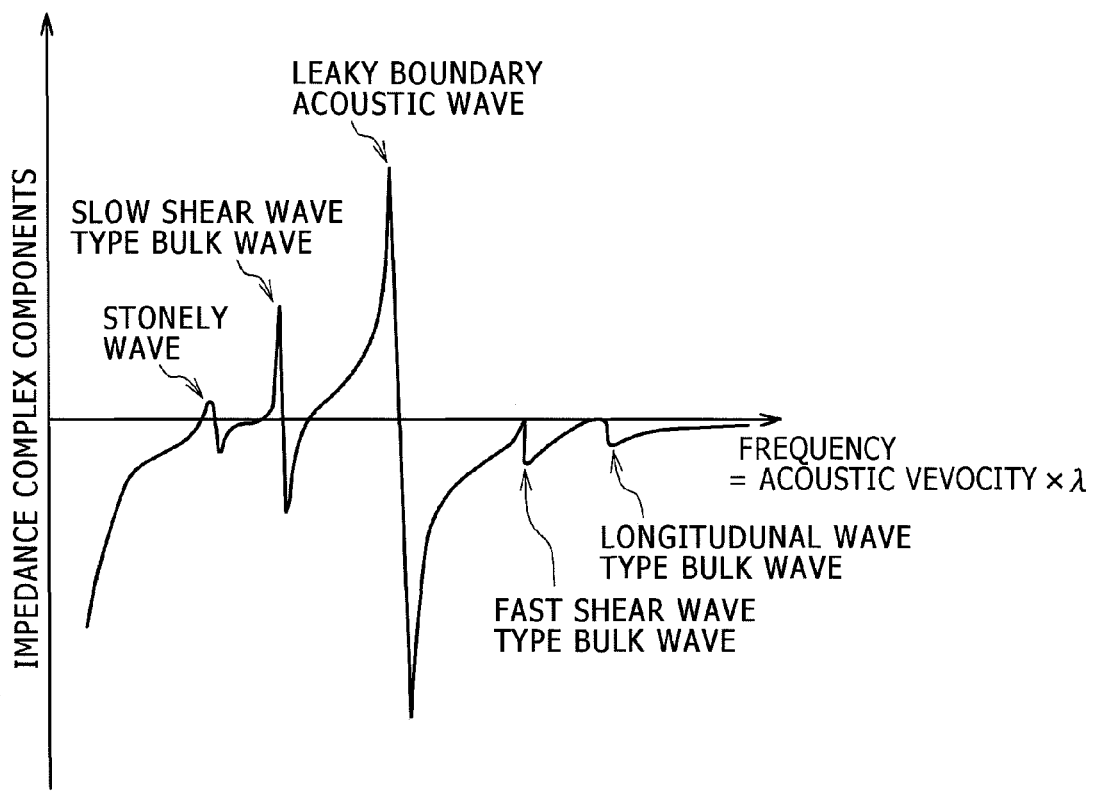
FIG. 23 is a graph for describing the spurious acoustic waves generated per the impedance characteristics of the leaky acoustic boundary wave resonator.
Figure 24:
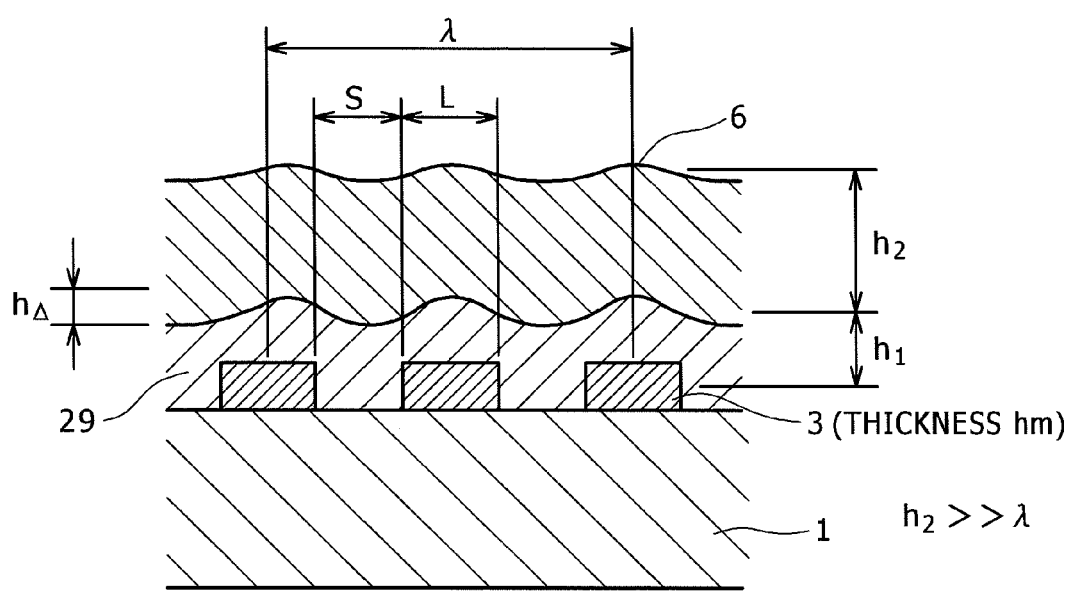
FIG. 24 is a drawing showing an example of the structure of the boundary acoustic wave resonator disclosed in WO98/52279.
Figure 25:
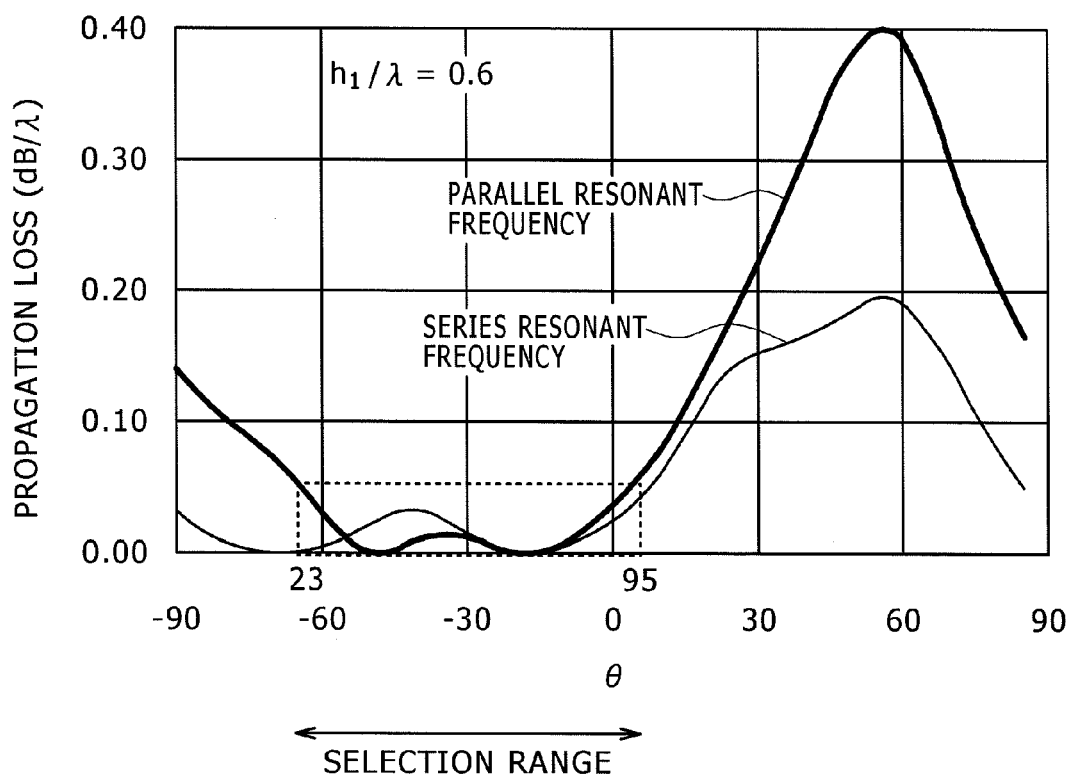
FIG. 25 is a graph showing the range of the theta (θ) formed by an acoustic Q value of a thousand or higher (propagation loss in a range of 0.056 dB or lower) described in WO98/52279.

FIG. 22 is a graph for showing the relation of boundary acoustic wave characteristics with the medium for sealing the boundary acoustic waves. Here a comparison was made using aluminum nitride AlN and silicon nitride SiNz as typical nitrogen films; aluminum oxide AlOx as a high-speed oxidizer film; and polycrystalline silicon Si and diamond C as high acoustic speed, non-nitrogen, non-oxygen films. In embodiments, 1 through 6, an example utilizing aluminum nitride AlN film as a medium for sealing in the boundary acoustic waves was described. However, the same characteristics/effects can be obtained even if silicon nitride SiNx film or high-speed oxidizer AlOx film is used.

What is claimed is:

1. An acoustic wave device comprising:
a first medium of lithium niobate piezoelectric single crystal as the main constituent, and having a flat surface cut out in a theta θ rotated Y cut;
a third medium containing aluminum oxide or nitrogen material as the main constituent;
a second medium containing silicon oxide as the main constituent, and enclosed by the first medium and the third medium; and
a reflector and IDT (inter-digital transducer) formed on the flat surface of the first medium, and enclosed by the first medium and the second medium; and
the IDT mainly excites the boundary acoustic waves, wherein
the IDT is included of metal containing aluminum as the main constituent;
the reflector is a shorted type reflector;
and when the wavelength of the boundary acoustic wave is set as lambda (λ), the thickness of the reflector as hr, the thickness of the second medium as h1, and the thickness of the IDT as hm, then:

$$(h1+hm)/\lambda \leq 77.0\%$$

$$2.5 \leq hr/\lambda \leq 8.5\%.$$

2. The acoustic wave device according to claim 1, wherein when the thickness of the second medium is set as h1, and the thickness of the IDT as hm,
then:

$$149° \leq \theta \leq 171°, \text{ and moreover}$$

$$(h1+hm)/\lambda \leq 62\%.$$

3. The acoustic wave device according to claim 1, wherein $$0 \leq hm/\lambda \leq 0.07 \text{ and,}$$

$$149° \leq \theta \leq 171°, \text{ and moreover}$$

$$47.5\% \leq h1/\lambda.$$

4. The acoustic wave device according to claim 3, wherein $$153° \leq \theta \leq 165°, \text{ and moreover}$$

$$52.5\% \leq h1/\lambda \leq 67.5\%.$$

5. The acoustic wave device according to claim 4, wherein $$159° \leq \theta \leq 161°, \text{ and moreover}$$

$$52.5\% \leq h1/\lambda \leq 57.5\%, \text{ and moreover}$$

$$1\% \leq hm \leq 5\%.$$

6. The acoustic wave device according to claim 3, wherein the thickness of the third medium on the IDT is larger than one-half the λ.

7. The acoustic wave device according to claim 3, wherein an activator film is formed to boost the sealing between the silicon oxide film and the film containing nitrogen material or aluminum oxide as the main constituent.

8. A high frequency filter comprising a substrate and multiple acoustic wave devices formed on that substrate, wherein at least one of the acoustic wave devices is the acoustic wave device according to claim 1.

9. An acoustic wave device comprising:
a first medium of lithium niobate piezoelectric single crystal or a lithium tantalate piezoelectric single crystal as the main constituent;
a second medium containing silicon oxide as the main constituent;
a third medium whose constituent is a material different from either or both the first medium and the second medium;
an IDT that mainly excites boundary acoustic waves; and
the second medium is enclosed between the first medium and the third medium;
the IDT is enclosed between the first medium and the second medium;
an acoustic insulation region in which the thickness of at least either the second medium or the third medium is half the thickness on the IDT, and is formed on at least a portion of regions other than the IDT.

10. The acoustic wave device according to claim 9, wherein when the wavelength of the boundary acoustic wave is set as lambda (λ), the thickness of the IDT as hm, and the thickness of the second medium as h1, then:

$0 \leq hm/\lambda \leq 0.07$, $149° \leq \theta \leq 171°$, and moreover $47.5\% \leq h1/\lambda \leq 77.5\%$.

11. The acoustic wave device according to claim 10, wherein
the acoustic wave device is comprised of at least two one-port resonators, and
an acoustic insulation region is formed between each resonator.

12. The acoustic wave device according to claim 10, wherein
the acoustic wave device is comprised of at least two one-port resonators, and
an acoustic insulator region is formed between the edge of the first medium and the edge of each resonator.

13. The acoustic wave device according to claim 10, wherein
resin is added to the acoustic insulation region.

14. The acoustic wave device according to claim 10, wherein
when a second medium at thickness of h1$a$ is formed on the IDT,
a thin film region of a second medium at a thickness of h1$b$ is formed at $0 \leq h1b < h1a$, on at least a portion of regions other than the IDT.

15. The acoustic wave device according to claim 14, wherein
the acoustic wave device is comprised of at least two one-port resonators, and
a thin film region is formed between each of the resonators, or between the edges of each resonator and the edge of the first medium.

16. The acoustic wave device according to claim 9, comprising a heat discharge terminal made from metal film integrated with the IDT, and at least a portion of the heat discharge terminal is formed between the first medium and the second medium;
and when the thickness of the second medium is set to h1$c$,
the second medium is set to a thin dimension on at least a portion of regions on the metal film, and when the thickness of the second medium for that portion is set to h1$d$, then $0 \leq h1d \leq h1c/2$.

17. A high frequency filter comprising a substrate and multiple acoustic wave devices formed on that substrate, wherein at least one of the acoustic wave devices is the acoustic wave device according to claim 9.

18. An acoustic wave device comprising:
a first medium of lithium niobate piezoelectric single crystal as the main constituent, and having a flat surface cut out in a theta (θ) rotated Y cut;
a third medium containing aluminum oxide or nitrogen material as the main constituent;
a second medium containing silicon oxide as the main constituent, and enclosed by the first medium and the third medium; and
a reflector and IDT (inter-digital transducer) formed on the flat surface of the first medium, and enclosed by the first medium and the second medium; and
the IDT mainly excites the boundary acoustic waves, wherein
the mode of the boundary acoustic waves are changed between the IDT and the reflector.

19. The acoustic wave device according to claim 18, wherein
the IDT is comprised of metallic layers mainly containing metal containing aluminum as the main constituent, and
the reflector is included of metallic layers containing a metal possessing a density larger than 4500 kg/m$^3$ as the main constituent.

20. A high frequency filter comprising a substrate and multiple acoustic wave devices formed on that substrate, wherein at least one of the acoustic wave devices is the acoustic wave device according to claim 18.

* * * * *